United States Patent
Nakanishi

(10) Patent No.: US 6,707,330 B2
(45) Date of Patent: Mar. 16, 2004

(54) SEMICONDUCTOR DEVICE HAVING INTERNAL CIRCUIT OPERATING IN SYNCHRONIZATION WITH INTERNAL CLOCK SIGNAL

(75) Inventor: Jingo Nakanishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/212,707

(22) Filed: Aug. 7, 2002

(65) Prior Publication Data

US 2003/0117188 A1 Jun. 26, 2003

(30) Foreign Application Priority Data

Dec. 21, 2001 (JP) .......................... 2001-390117

(51) Int. Cl.$^7$ .............................................. H03K 3/017
(52) U.S. Cl. ....................... 327/158; 327/122; 327/291; 327/113
(58) Field of Search ................................ 327/117, 122, 327/113, 291, 158, 156, 270

(56) References Cited

U.S. PATENT DOCUMENTS

| | | | | |
|---|---|---|---|---|
| 5,514,990 A | * | 5/1996 | Mukaine et al. ............ | 327/116 |
| 5,963,071 A | * | 10/1999 | Dowlatabadi ............... | 327/175 |
| 6,087,864 A | * | 7/2000 | Aoki ........................... | 327/116 |
| 6,426,660 B1 | * | 7/2002 | Ho et al. ..................... | 327/175 |
| 6,466,073 B1 | * | 10/2002 | Yukinari et al. ............ | 327/291 |

FOREIGN PATENT DOCUMENTS

JP 7-253825 10/1995

OTHER PUBLICATIONS

Nasser A. Kurd et al., "Multi–GHz Clocking Scheme for Intel® Pentium® 4 Microprocessor", Digest of Techinical Papers of 2001 IEEE International Solid–State Circuits Conference, Feb. 7, 2001, pp. 404–405.

* cited by examiner

Primary Examiner—Dinh T. Le
(74) Attorney, Agent, or Firm—McDermott, Will & Emery

(57) ABSTRACT

A semiconductor integrated circuit chip includes a replica circuit for delaying a reference clock signal, a delay detector for controlling a delay time of the replica circuit such that the delay time of replica circuit becomes one-fourth the period of the reference clock signal, and an EX-OR gate that receives the reference clock signal and an output clock signal from replica circuit for supplying to a logic circuit an internal clock signal that is obtained by multiplying the reference clock signal by two. Thus, the consumed power can be kept small in comparison with the conventional example in which an internal clock signal is propagated on a clock line.

17 Claims, 24 Drawing Sheets

SEMICONDUCTOR DEVICE HAVING INTERNAL CIRCUIT OPERATING IN SYNCHRONIZATION WITH INTERNAL CLOCK SIGNAL

BACKGROUND OF THE INVENTION

1. Field of the Invention

The present invention relates to a semiconductor device, and more specifically to a semiconductor device having an internal circuit that operates in synchronization with an internal clock signal.

2. Description of the Background Art

FIG. 33 is a circuit block diagram representing an arrangement of a conventional semiconductor integrated circuit chip 71. In FIG. 33, semiconductor integrated circuit chip 71 includes a semiconductor substrate 72, a PLL (Phase Locked Loop) circuit 73 formed on a surface of semiconductor substrate 72, a clock buffer 74, and a plurality of (two in the diagram) logic circuits 75. PLL circuit 73 multiplies by a plural number a reference clock signal RCLK externally supplied via a clock terminal T to generate an internal clock signal intCLK. Internal clock signal intCLK is transmitted to a plurality of logic circuits 75 via clock buffer 74 and a clock line CL. Each logic circuit 75 performs a prescribed operation in synchronization with internal clock signal intCLK.

In the conventional semiconductor integrated circuit chip 71, however, internal clock signal intCLK having a frequency that is several-fold that of reference clock signal RCLK was supplied to each logic circuit 75 via clock buffer 74 and clock line CL so that there was a problem that the consumed power for charging and discharging clock line CL was too great.

When as many PLL circuits 73 as logic circuits 75 are provided, arranging each PLL circuit 73 in the vicinity of a corresponding logic circuit 75, and reference clock signal RCLK is supplied to each PLL circuit 73 via clock line CL, the consumed power of clock line CL becomes small since the frequency of reference clock signal RCLK is lower than the frequency of internal clock signal intCLK. The layout area would increase by the amount of the added PLL circuits 73, however.

SUMMARY OF THE INVENTION

Thus, the main object of the present invention is to provide a semiconductor device that requires small consumed power and small layout area.

A semiconductor device according to the present invention includes an internal circuit that operates in synchronization with an internal clock signal, a first delay circuit having a first delay time that is controlled by a control signal for delaying a reference clock signal, a second delay circuit having a second delay time that is controlled by the control signal and that is derived by multiplying the first delay time by a first proportionality constant for delaying the reference clock signal, a phase control circuit for comparing phases of the reference clock signal and an output clock signal from the first delay circuit to generate and supply to the first and second delay circuits the control signal such that a phase difference thereof becomes a predetermined value, and an internal clock generating circuit for generating and supplying to the internal circuit the internal clock signal obtained by multiplying the reference clock signal based on the reference clock signal and an output clock signal from the second delay circuit. Consequently, even in the case where a plurality of internal circuits exist, only one set of the first delay circuit and the phase control circuit needs to be provided for the multiple sets of the second delay circuit and the internal clock generating circuit so that reduction in the consumed power and in the layout area can be achieved.

Moreover, another semiconductor device according to the present invention includes an internal circuit that operates in synchronization with an internal clock signal, a frequency divider for dividing an external clock signal to generate a reference clock signal, a first delay circuit having a first delay time that is controlled by a control signal for delaying the external clock signal, a second delay circuit having a second delay time that is controlled by the control signal and that is derived by multiplying the first delay time by a predetermined proportionality constant for delaying the reference clock signal, a phase control circuit for comparing phases of the external clock signal and an output clock signal from the first delay circuit to generate and supply to the first and second delay circuits the control signal such that a phase difference thereof becomes a predetermined value, and an internal clock generating circuit for generating and supplying to the internal circuit the internal clock signal obtained by multiplying the reference clock signal based on the reference clock signal and an output clock signal from the second delay circuit. Consequently, even in the case where a plurality of internal circuits exist, only one set of the first delay circuit and the phase control circuit needs to be provided for multiple sets of the second delay circuit and the internal clock generating circuit so that reduction in the consumed power and in the layout area can be achieved. In addition, the first delay circuit delays the external clock signal so that the circuit scale of the first delay circuit can be kept small in comparison with the case where the reference clock signal generated in the frequency divider is delayed.

Moreover, a further semiconductor device according to the present invention includes an internal circuit that operates in synchronization with an internal clock signal, a ring oscillator for generating a first clock signal having a period controlled by a control signal, a delay circuit having a delay time that is controlled by the control signal and that is derived by multiplying the period of the first clock signal by a predetermined proportionality constant for delaying the first clock signal, a frequency divider for dividing the first clock signal to generate a second clock signal, a phase control circuit for comparing phases of a reference clock signal and the second clock signal and generating and supplying to the ring oscillator and the delay circuit the control signal such that a phase difference thereof becomes a predetermined value, and an internal clock generating circuit for generating and supplying to the internal circuit the internal clock signal that is obtained by multiplying the reference clock signal based on the first clock signal and an output clock signal from the delay circuit. Consequently, even when a plurality of internal circuits exist, only one set of the ring oscillator, the frequency divider, and the phase control circuit needs to be provided for multiple sets of the delay circuit and the internal clock generating circuit so that reduction in the consumed power and in the layout area can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
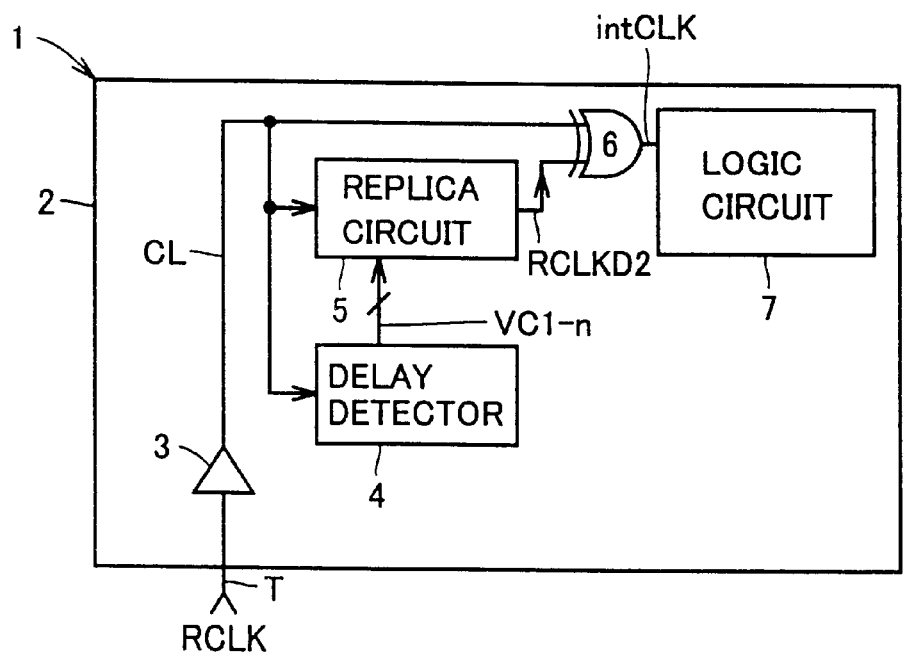
FIG. 1 is a circuit block diagram representing an arrangement of a semiconductor integrated circuit chip according to a first embodiment of the present invention.

FIG. 1 is a circuit block diagram representing an arrangement of a semiconductor integrated circuit chip 1 according to the first embodiment of the present invention. In FIG. 1, semiconductor integrated circuit chip 1 includes a semiconductor substrate 2, a clock buffer 3 formed on a surface of semiconductor substrate 2, a delay detector 4, a replica circuit 5, an EX-OR gate 6, and a logic circuit 7. Delay detector 4, replica circuit 5, and EX-OR gate 6 are provided in the vicinity of logic circuit 7.

Clock buffer 3 transmits a reference clock signal RCLK supplied via a clock terminal T from outside to inside chip 1 via a clock line CL. Replica circuit 5 delays reference clock signal RCLK from clock buffer 3 by a variable delay time. Based on reference clock signal RCLK from clock buffer 3, delay detector 4 controls replica circuit 5 such that the variable delay time of replica circuit 5 becomes equal to one-fourth period of reference clock signal RCLK.

Figure 2:
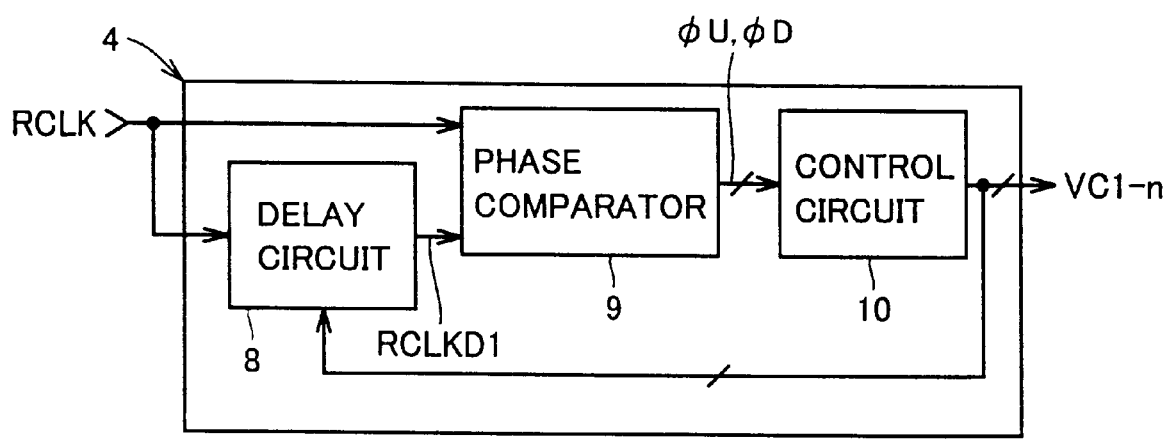
FIG. 2 is a block diagram representing an arrangement of a delay detector shown in FIG. 1.
Figure 3:
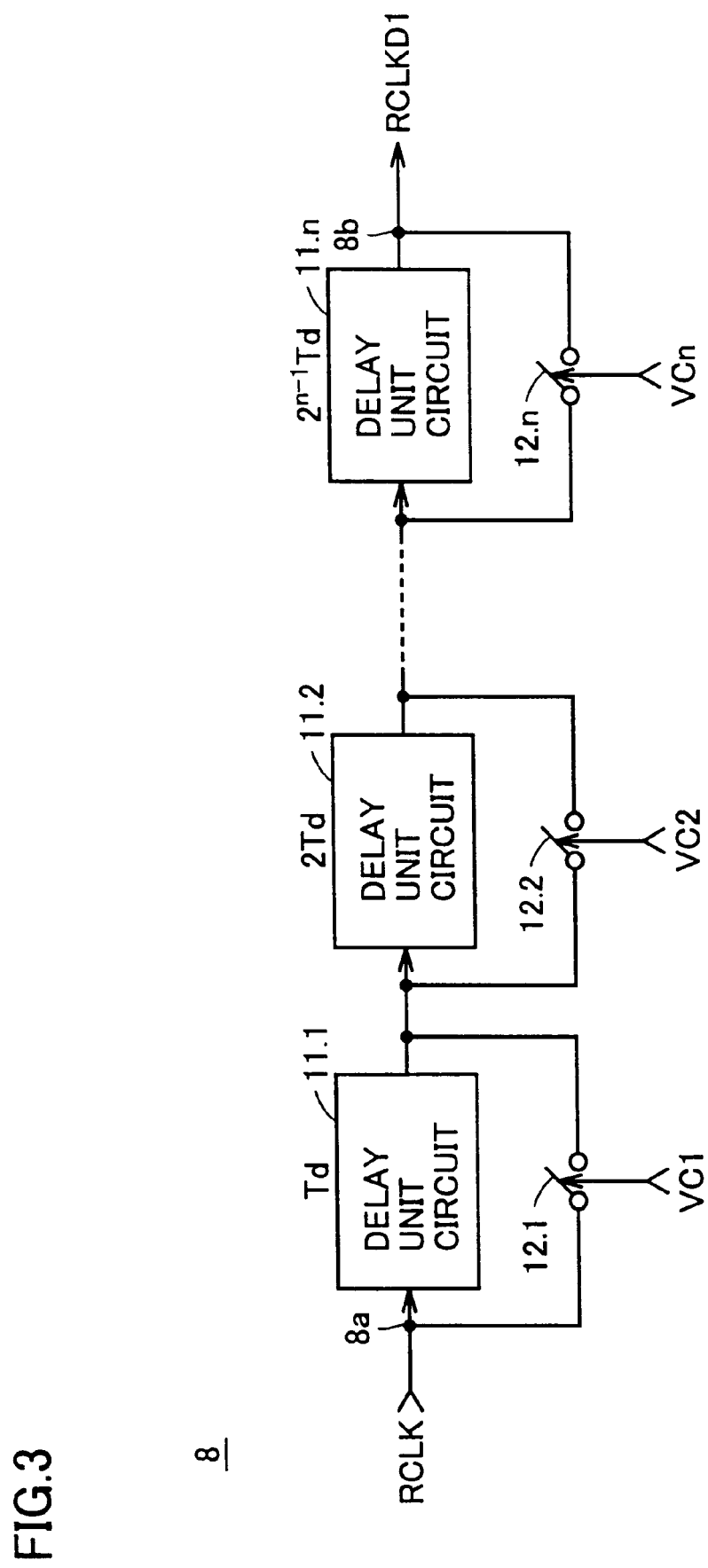
FIG. 3 is a circuit block diagram representing an arrangement of a delay circuit shown in FIG. 2.

More specifically, delay detector 4 is an applied example of a DLL (Delay Locked Loop) circuit as shown in FIG. 2, and includes a delay circuit 8, a phase comparator 9, and a control circuit 10. As shown in FIG. 3, delay circuit 8 includes n delay unit circuits 11.1 to 11.n connected in series between an input node 8a and an output node 8b (n is a natural number), and switches 12.1 to 12.n connected in parallel to delay unit circuits 11.1 to 11.n, respectively.

Delay unit circuit 11.1 has a prescribed delay time Td. The delay times of delay unit circuits 11.1 to 11.n are successively doubled so that the delay time of delay unit circuit 11.n becomes $2^{n-1}Td$. Switches 12.1 to 12.n are respectively controlled by control signals VC1 to VCn from control circuit 10. Switch 12.n is rendered conductive when control signal VCn is at the logic low or "L" level, and is rendered non-conductive when control signal VCn is at the logic high or "H" level. When switch 12.n is rendered conductive, the output node of delay unit circuit 11.n, for example, is set to a high impedance state, and the delay by delay unit circuit 11.n is rendered invalid. For instance, when control signals VC1 to VCn all attain the "L" level, switches 12.1 to 12.n are rendered conductive and the delay time of delay circuit 8 becomes 0. When control signals VC1 to VCn all attain the "H" level, switches 12.1 to 12.n are rendered non-conductive, and the delay time of delay circuit 8 becomes the total sum of delay times Td to $2^{n-1}Td$ of delay unit circuits 11.1 to 11.n. By setting each of control signals VC1 to VCn to the "H" level or the "L" level, the delay time of delay circuit 8 can be changed in $2^n$ stages.

Referring back to FIG. 2, phase comparator 9 compares the phases of reference clock signal RCLK and an output clock signal RCLKD1 from delay circuit 8 in synchronization with reference clock signal RCLK from clock buffer 3, and outputs a pulse signal φU when the phase of clock signal RCLKD1 lags behind the phase of reference clock signal RCLK, and outputs a pulse signal φD when the phase of clock signal RCLKD1 leads before the phase of reference clock signal RCLK.

Figure 4:
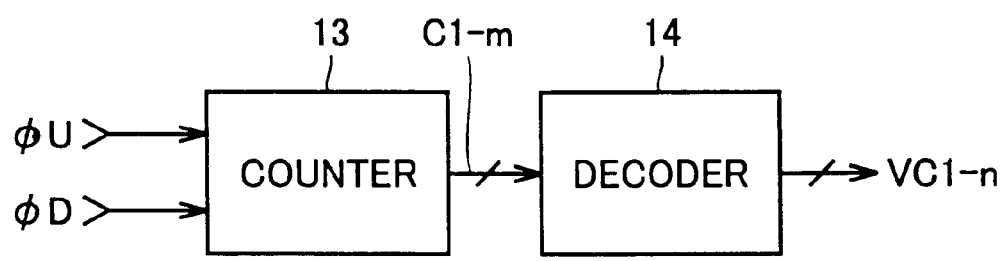
FIG. 4 is a block diagram representing an arrangement of a control circuit shown in FIG. 2.

As shown in FIG. 4, control circuit 10 includes a counter 13 and a decoder 14. Counter 13 decrements by one the count value of count signals C1 to Cm (m is a natural number) in response to pulse signal $\phi U$, and increments by one the count value of count signals C1 to Cm in response to pulse signal $\phi D$. Consequently, when the phase of a delayed clock signal RCLKD1 lags behind the phase of reference clock signal RCLK, the count value of count signals C1 to Cm gradually decreases, and when the phase of delayed clock signal RCLKD1 leads before the phase of reference clock signal RCLK, the count value of count signals C1 to Cm gradually increases.

Decoder 14 decodes count signals C1 to Cm from counter 13 to generate control signals VC1 to VCn, and supplies control signals VC1 to VCn to delay circuit 8 to control the delay time of delay circuit 8. Decoder 14 shortens the delay time of delay circuit 8 and advances the phase of delayed clock signal RCLKD1 when the count value of count signals C1 to Cm decreases, and lengthens the delay time of delay circuit 8 and delays the phase of delayed clock signal RCLKD1 when the count value of count signals C1 to Cm increases. Consequently, the phase of delayed clock signal RCLKD1 and the phase of reference clock signal RCLK would match. At this time, the phase of delayed clock signal RCLKD1 lags behind by exactly one period from the phase of reference clock signal RCLK.

Figure 5:
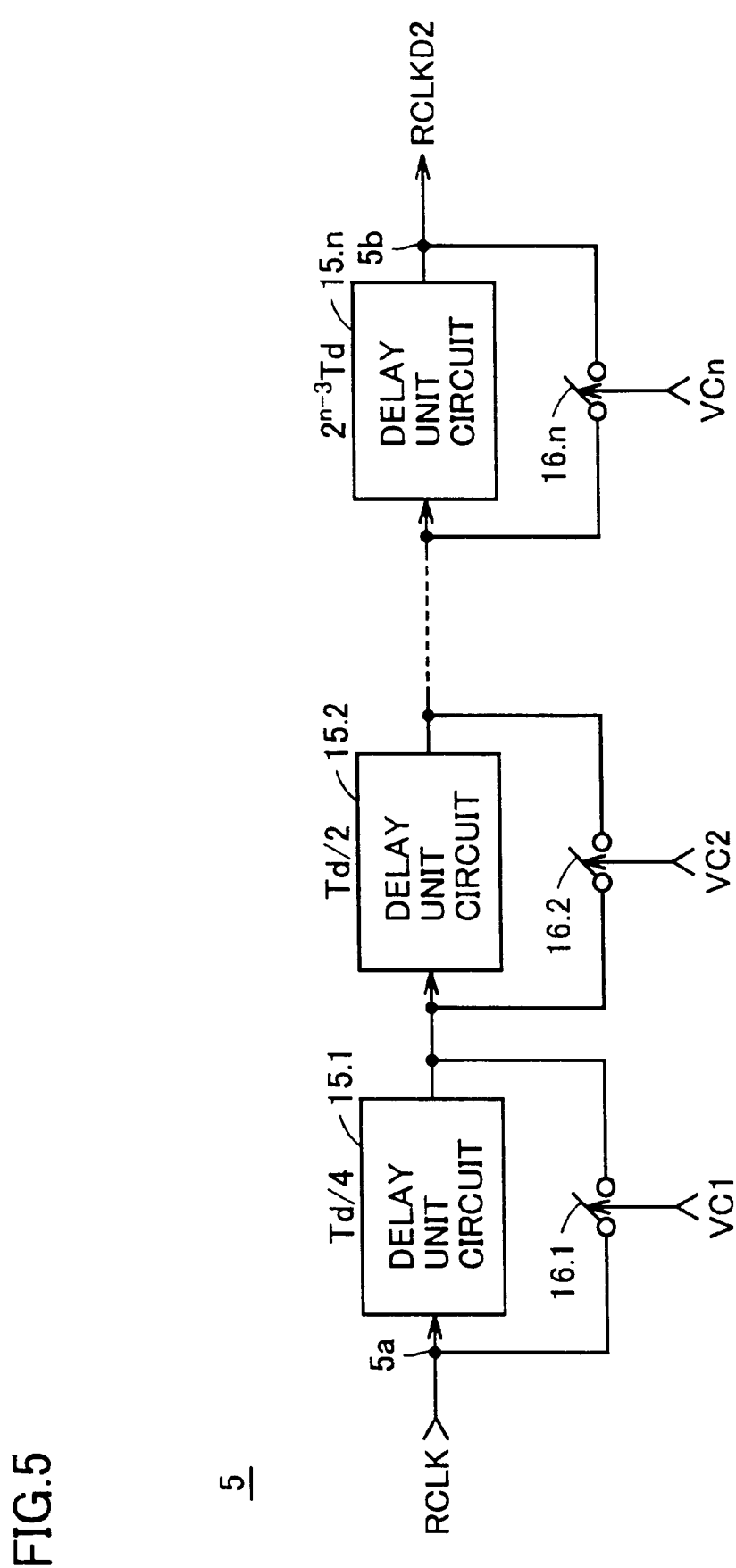
FIG. 5 is a circuit block diagram representing an arrangement of a replica circuit shown in FIG. 1.

As shown in FIG. 5, replica circuit 5 includes n delay unit circuits 15.1 to 15.$n$ connected in series between an input node 5$a$ and an output node 5$b$, and switches 16.1 to 16.$n$ connected in parallel to delay unit circuits 15.1 to 15.$n$, respectively.

Delay unit circuits 15.1 to 15.$n$ respectively have delay times Td/4 to $2^{n-3}$Td that are one-fourth of delay times Td to $2^{n-1}$Td of delay unit circuits 11.1 to 11.$n$ of delay circuit 8. For instance, delay unit circuit 15.1 is formed by four stages of inverters, while delay unit circuit 11.1 is formed by 16 stages of inverters. Switches 16.1 to 16.$n$ are respectively controlled by control signals VC1 to VCn from control circuit 10. Switch 16.$n$ is rendered conductive when control signal VCn is at the "L" level, and is rendered nonconductive when control signal VCn is at the "H" level. Consequently, the delay time of replica circuit 5 constantly becomes one-fourth of the delay time of delay circuit 8.

Figure 6:
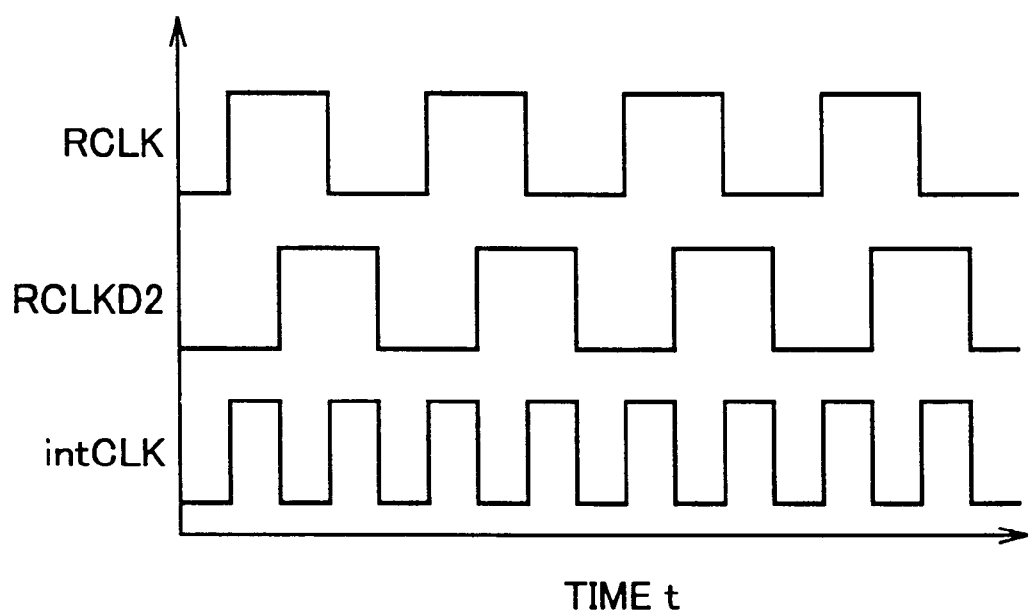
FIG. 6 is a timing chart showing an operation of the semiconductor integrated circuit chip shown in FIGS. 1 to 5.

Referring back to FIG. 1, EX-OR gate 6 receives reference clock signal RCLK from clock buffer 3 and an output clock signal RCLKD2 from replica circuit 5, and outputs internal clock signal intCLK. As shown in FIG. 6, the phase of a delayed clock signal RCLKD2 lags behind by one-fourth period or 90° from the phase of reference clock signal RCLK. Internal clock signal intCLK attains the "L" level when the levels of clock signals RCLK and RCLKD2 coincide, and attains the "H" level when they do not coincide. Consequently, internal clock signal intCLK becomes the clock signal obtained by multiplying reference clock signal RCLK by two. Logic circuit 7 performs a prescribed operation in synchronization with internal clock signal intCLK.

Next, an operation of semiconductor integrated circuit chip 1 will be briefly described. Reference clock signal RCLK is supplied to delay detector 4, replica circuit 5, and EX-OR gate 6 via clock terminal T, clock buffer 3, and clock line CL from outside. In delay detector 4, control signals VC1 to VCn are generated such that the phase of output clock signal RCKLD1 of delay circuit 8 lags behind by one period (360°) from the phase of reference clock signal RCLK.

Control signals VC1 to VCn are also supplied to replica circuit 5. The delay time of replica circuit 5 constantly becomes one-fourth of the delay time of delay circuit 8. Consequently, the phase of an output clock signal RCLKD2 of replica circuit 5 lags behind by one-fourth period (90°) from the phase of reference clock signal RCLK. Reference clock signal RCLK and delayed clock signal RCLKD2 are supplied to EX-OR gate 6. An output clock signal intCLK from EX-OR gate 6 becomes the clock signal that is obtained by multiplying reference clock signal RCLK by two. Logic circuit 7 operates at a frequency that is two times the frequency of reference clock signal RCLK.

According to the first embodiment, delay detector 4, replica circuit 5, and EX-OR gate 6 that generate internal clock signal intCLK are provided in the vicinity of logic circuit 7, and reference clock signal RCLK is supplied to delay detector 4, replica circuit 5, and EX-OR gate 6 via clock terminal T, clock buffer 3, and clock line CL. Thus, in comparison with the conventional example in which internal clock signal intCLK is supplied to logic circuit 75 via clock buffer 74 and clock line CL, the consumed power in the clock buffer and clock line CL can be kept small.

Moreover, needless to say, although internal clock signal intCLK is generated by EX-OR gate 6 in the first embodiment, EX-OR gate 6 may be replaced with an EX-NOR gate.

Figure 7:
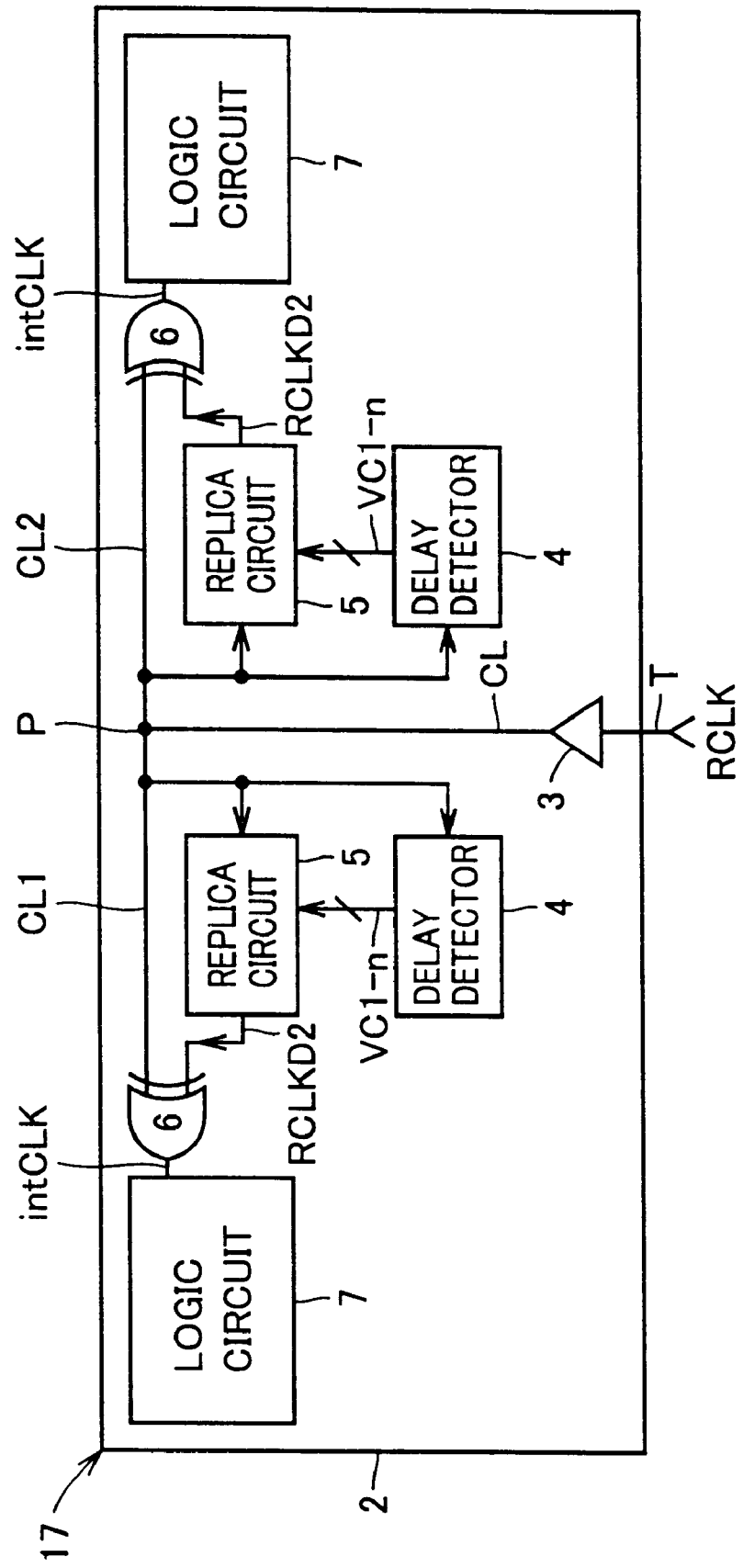
FIGS. 7 to 9 are circuit block diagrams representing modifications to the first embodiment.

Various modifications will be described below. A semiconductor integrated circuit chip 17 of FIG. 7 is provided with multiple sets (two sets in the diagram) of delay detector 4, replica circuit 5, EX-OR gate 6, and logic circuit 7. Clock lines CL1 and CL2 from a branch point P of a clock line CL to two EX-OR gates 6 are identical in length. Consequently, the delay time of reference clock signal RCLK in clock lines CL1 and CL2 can be made equal, and the phases of two internal clock signals intCLK can be made to match.

Figure 8:
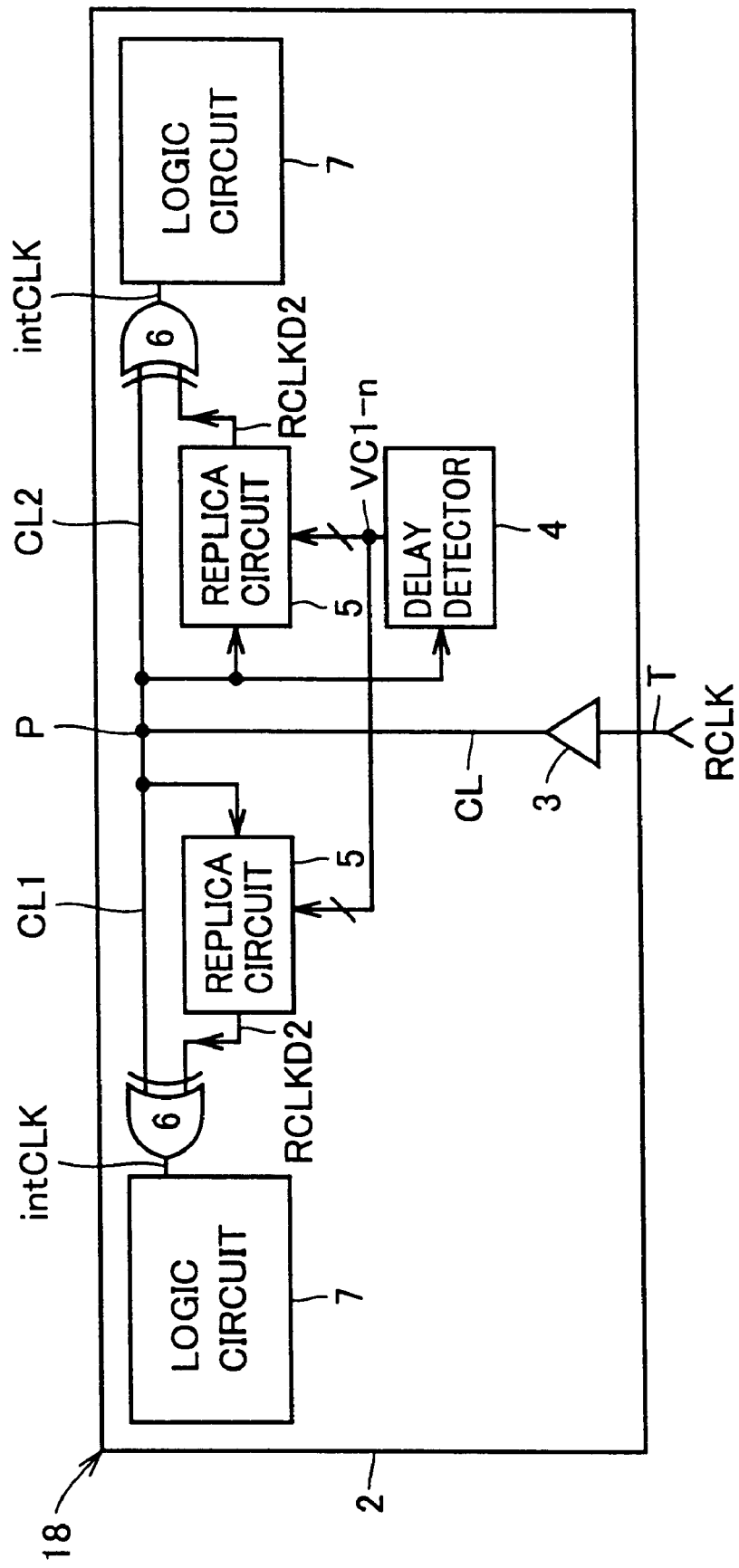

A semiconductor integrated circuit chip 18 of FIG. 8 is provided with multiple sets (two sets in the diagram) of replica circuit 5, EX-OR gate 6, and logic circuit 7, and a delay detector 4 is provided in common to the two sets of replica circuit 5, EX-OR gate 6, and logic circuit 7. In this case, only one delay detector 4 is required so that the circuit scale and the layout area can be kept small.

Figure 9:
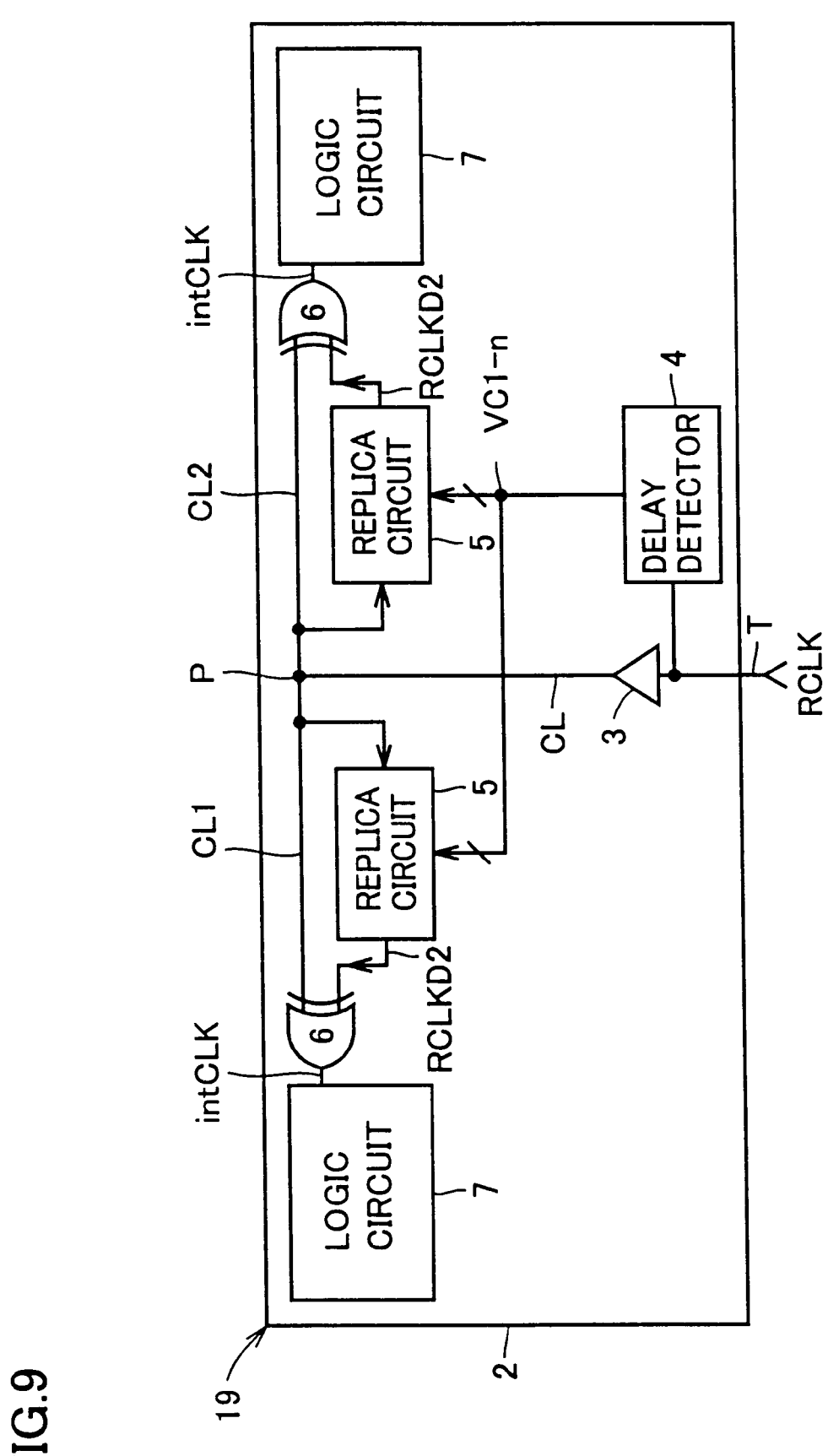

A semiconductor integrated circuit chip 19 of FIG. 9 differs from semiconductor integrated circuit chip 18 of FIG. 8 in that delay detector 4 receives reference clock signal RCLK not via clock line CL but via clock terminal T. In this case, delay detector 4 can be disposed in a peripheral portion of chip 19 so that delay detector 4 can be laid out with ease.

Second Embodiment

Figure 10:
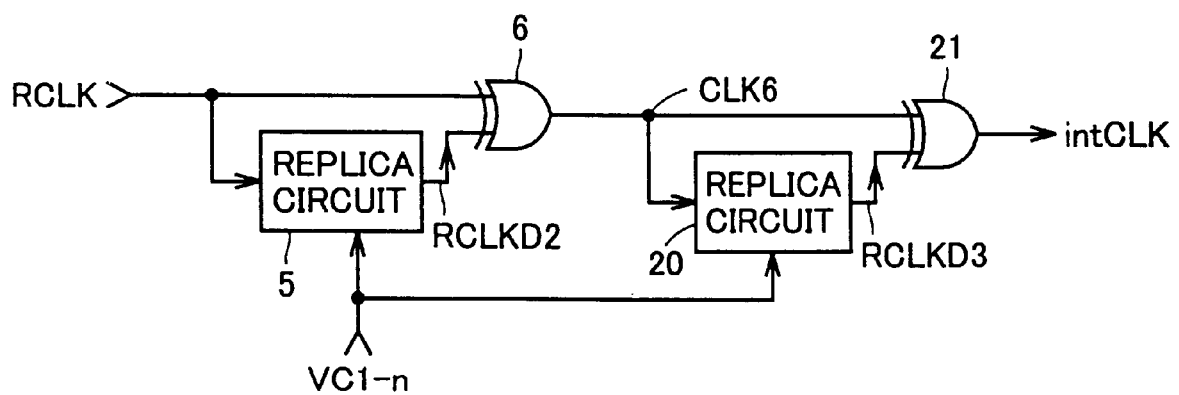
FIG. 10 is a circuit block diagram representing a main portion of a semiconductor integrated circuit chip according to a second embodiment of the present invention.

FIG. 10 is a circuit block diagram representing the main portion of a semiconductor integrated circuit chip according to the second embodiment of the present invention. Referring to FIG. 10, this semiconductor integrated circuit chip differs from chip 1 of FIG. 1 in that a replica circuit 20 and an EX-OR gate 21 are additionally provided.

Figure 11:
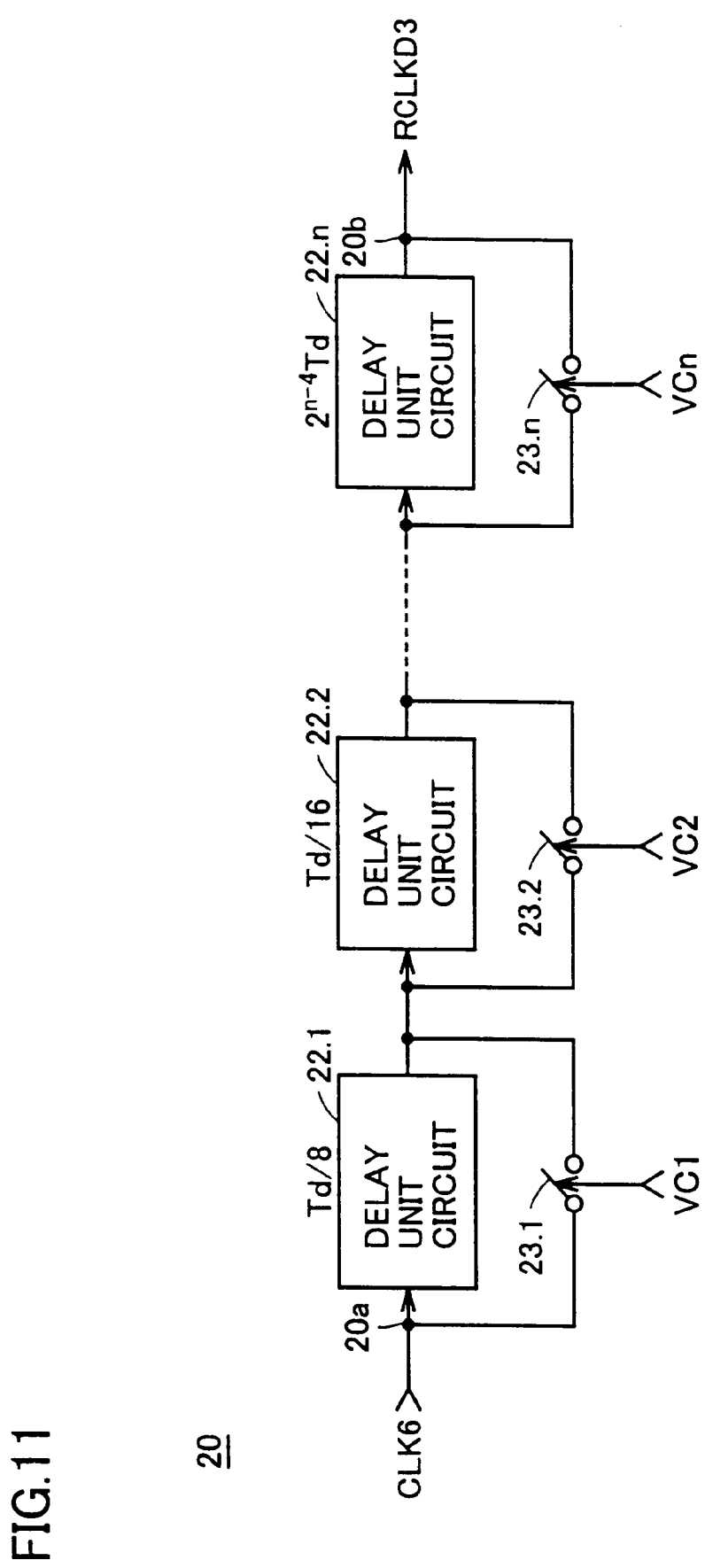
FIG. 11 is a circuit block diagram representing an arrangement of a replica circuit 20 shown in FIG. 10.

Replica circuit 20 delays an output clock signal CLK6 from EX-OR gate 6 by one-eighth the period of reference clock signal RCLK. Thus, as shown in FIG. 11, replica circuit 20 includes n delay unit circuits 22.1 to 22.$n$ connected in series between an input node 20$a$ and an output node 20$b$, and switches 23.1 to 23.$n$ connected in parallel to delay unit circuits 22.1 to 22.$n$, respectively.

Delay unit circuits 22.1 to 22.$n$ respectively have delay times Td/8 to $2^{n-4}$Td that are one-eighth of delay times Td to $2^{n-1}$Td of delay unit circuits 11.1 to 11.$n$ of delay circuit 8. For instance, delay unit circuit 22.1 is formed by two stages of inverters, while delay unit circuit 11.1 is formed by 16 stages of inverters. Switches 23.1 to 23.n are respectively controlled by control signals VC1 to VCn from control circuit 10. Switch 23.n is rendered conductive when control signal VCn is at the "L" level, and is rendered nonconductive when control signal VCn is at the "H" level. Consequently, the delay time of replica circuit 20 constantly becomes one-eighth of the delay time of delay circuit 8.

Referring back to FIG. 10, EX-OR gate 21 receives output clock signal CLK6 from EX-OR gate 6 and an output clock signal RCLKD3 from replica circuit 20 to generate an internal clock signal intCLK.

Figure 12:
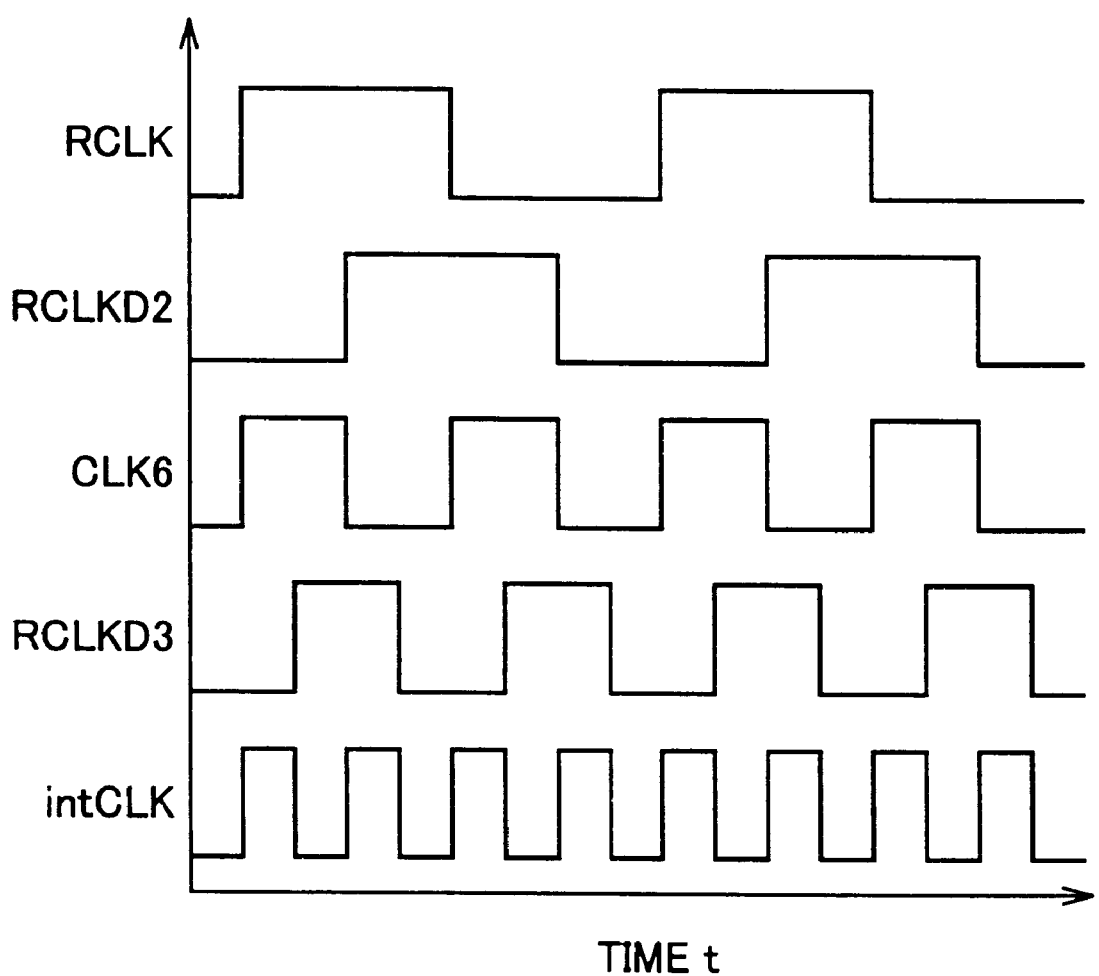
FIG. 12 is a timing chart showing an operation of the semiconductor integrated circuit chip shown in FIGS. 10 and 11.

FIG. 12 is a timing chart showing an operation of the semiconductor integrated circuit chip. In FIG. 12, output clock signal RCLKD2 from replica circuit 5 becomes the clock signal obtained by delaying reference clock signal RCLK by one-fourth the period of reference clock signal RCLK. Output clock signal CLK6 from EX-OR gate 6 becomes the clock signal that is obtained by multiplying reference clock signal RCLK by two. Output clock signal RCLKD3 from replica circuit 5 becomes the clock signal obtained by delaying output clock signal CLK6 from EX-OR gate 6 by one-eighth the period of reference clock signal RCLK. Internal clock signal intCLK attains the "L" level when the levels of clock signals CLK6 and RCLKD3 coincide, and attains the "H" level when they do not coincide. Thus, internal clock signal intCLK becomes the clock signal that is obtained by multiplying reference clock signal RCLK by four.

Moreover, needless to say, by employing a replica circuit that delays an output clock signal from EX-OR gate by ⅟₁₆ period (22.5°), ⅟₃₂ period (11.25°), and so on of reference clock signal RCLK, internal clock signal intCLK obtained by multiplying reference clock signal RCLK by 8, 16, and so on can be generated.

Third Embodiment

Figure 13:
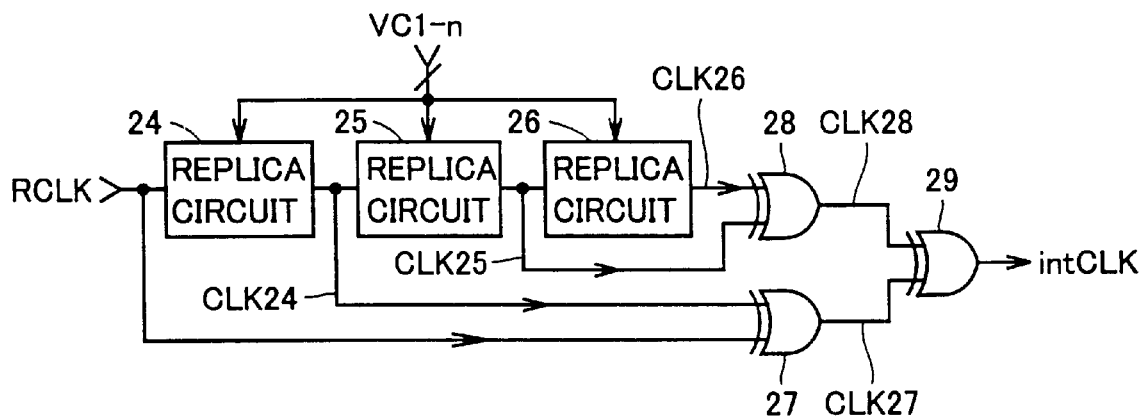
FIG. 13 is a circuit block diagram representing a main portion of a semiconductor integrated circuit chip according to a third embodiment of the present invention.

FIG. 13 is a circuit block diagram representing the main portion of a semiconductor integrated circuit chip according to the third embodiment of the present invention. Referring to FIG. 13, this semiconductor integrated circuit chip differs from semiconductor integrated circuit chip 1 of FIG. 1 in that replica circuit 5 and EX-OR gate 6 are replaced with replica circuits 24 to 26 and EX-OR gates 27 to 29.

Each of replica circuits 24 to 26 have the same arrangement as replica circuit 20 shown in FIG. 11. Replica circuit 24 delays reference clock signal RCLK by one-eighth period (45°) of reference clock signal RCLK. Replica circuit 25 delays an output clock signal CLK24 from replica circuit 24 by one-eighth the period of reference clock signal RCLK. Replica circuit 26 delays an output clock signal CLK25 from replica circuit 25 by one-eighth the period of reference clock signal RCLK.

EX-OR gate 27 receives reference clock signal RCLK and output clock signal CLK24 from replica circuit 24 and outputs a clock signal CLK27. EX-OR gate 28 receives output clock signals CLK25 and CLK26 from replica circuits 25 and 26 and outputs a clock signal CLK28. EX-OR gate 29 receives output clock signals CLK27 and CLK28 from EX-OR gates 27 and 28 and outputs an internal clock signal intCLK.

Figure 14:
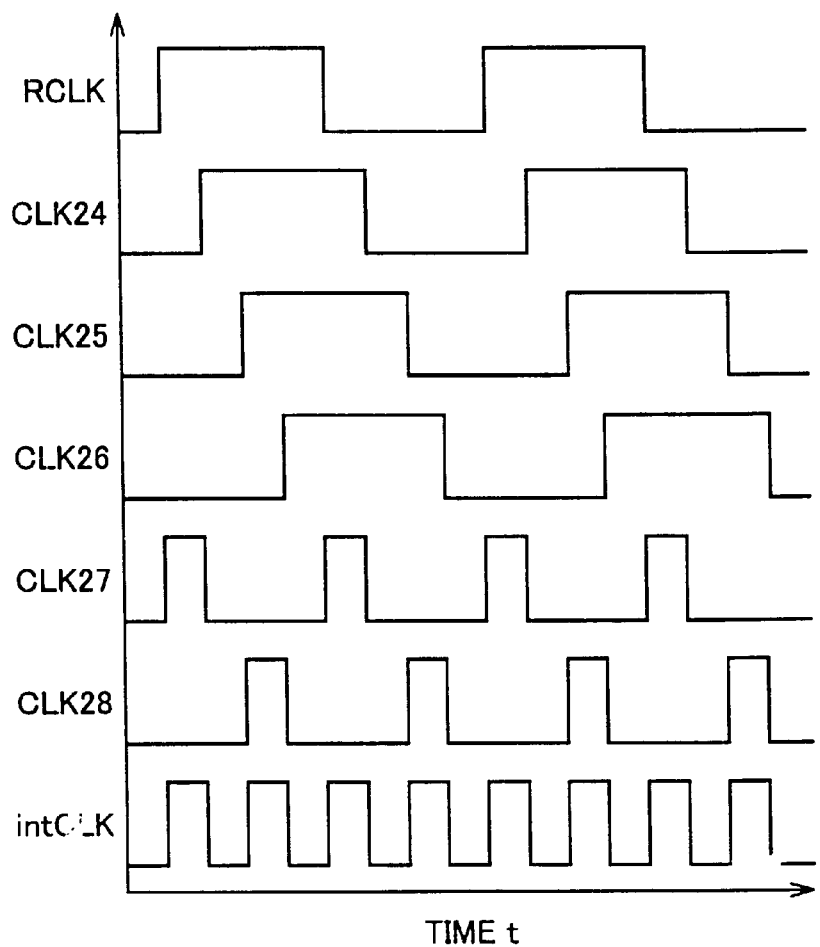
FIG. 14 is a timing chart showing an operation of the semiconductor integrated circuit chip shown in FIG. 13.

FIG. 14 is a timing chart showing an operation of the semiconductor integrated circuit chip. Referring to FIG. 14, output clock signals CLK24 to CLK26 of replica circuits 24 to 26 respectively become the clock signals obtained by delaying reference clock signal RCLK by one-eighth, two-eighths, and three-eighths the period of reference clock signal RCLK. Output clock signal CLK27 of EX-OR gate 27 attains the "L" level when the levels of clock signals RCLK and CLK24 coincide, and attains the "H" level when they do not coincide. Output clock signal CLK28 of EX-OR gate 28 attains the "L" level when the levels of clock signals CLK25 and CLK26 coincide, and attains the "H" level when they do not coincide. Output clock signal intCLK from EX-OR gate 29 attains the "L" level when the levels of clock signals CLK27 and CLK28 coincide, and attains the "H" level when they do not coincide. Consequently, internal clock signal intCLK becomes the clock signal obtained by multiplying reference clock signal RCLK by four.

In the third embodiment, the delay times of three replica circuits 24 to 26 can be made identical so that the semiconductor integrated circuit chip according to the third embodiment can be manufactured with greater ease than that of the second embodiment.

Moreover, needless to say, the second embodiment and the third embodiment may be combined to generate an internal clock signal intCLK having an even higher frequency.

Fourth Embodiment

Figure 15:
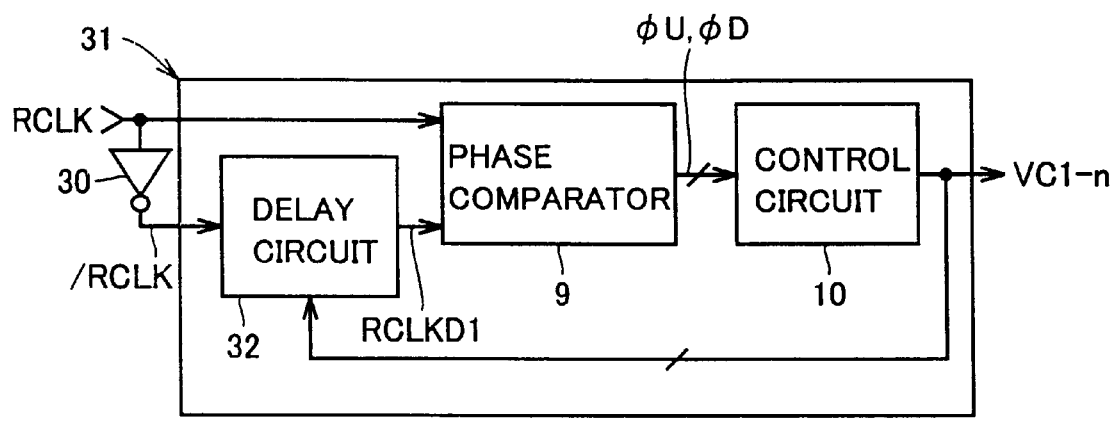
FIG. 15 is a circuit block diagram representing a main portion of a semiconductor integrated circuit chip according to a fourth embodiment of the present invention.

FIG. 15 is a circuit block diagram representing the main portion of a semiconductor integrated circuit chip according to the fourth embodiment of the present invention. Referring to FIG. 15, this semiconductor integrated circuit chip differs from semiconductor integrated circuit chip 1 of the first embodiment in that an inverter 30 is additionally provided and that delay detector 4 is replaced with a delay detector 31. Delay detector 31 has delay circuit 8 of delay detector 4 in FIG. 2 replaced with a delay circuit 32.

A reference clock signal RCLK is supplied directly to a phase comparator 9 as well as to delay circuit 32 via inverter 30. Phase comparator 9 and control circuit 10 control the delay time of delay circuit 32 such that the phases of reference clock signal RCLK and an output clock signal RCLKD1 from delay circuit 32 match.

While delay circuit 8 of FIG. 2 needs to delay reference clock signal RCLK by one period (360°) of reference clock signal RCLK, it suffices for delay circuit 32 of FIG. 15 to delay an inverted clock signal /RCLK of reference clock signal RCLK by one-half period (180°) of reference clock signal RCLK. Thus, the circuit scale of delay circuit 32 only needs to be one-half that of delay circuit 8. For instance, assuming that the initial delay unit circuit 11.1 included in delay circuit 8 is formed by 16 stages of inverters, the initial stage of delay unit circuit included in delay circuit 32 is formed by eight stages of inverters. Moreover, the delay time of replica circuit 5 constantly becomes one-half of the delay time of delay circuit 32.

Fifth Embodiment

Figure 16:
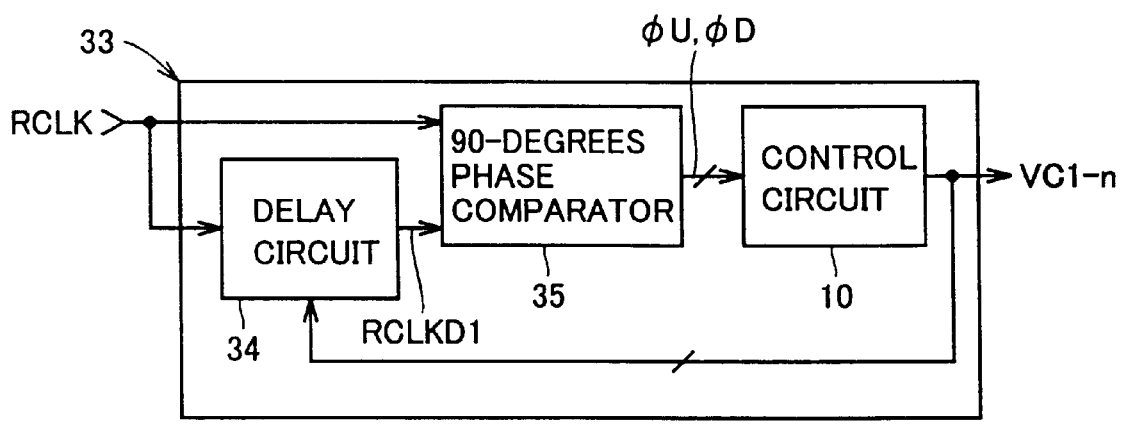
FIG. 16 is a block diagram representing a main portion of a semiconductor integrated circuit chip according to a fifth embodiment of the present invention.

FIG. 16 is a block diagram representing the main portion of a semiconductor integrated circuit chip according to the fifth embodiment of the present invention. Referring to FIG. 16, this semiconductor integrated circuit chip differs from semiconductor integrated circuit chip 1 of the first embodiment in that delay detector 4 is replaced with a delay detector 33. Delay detector 33 has delay circuit 8 and phase comparator 9 of delay detector 4 in FIG. 2 replaced with a delay circuit 34 and a 90-degrees phase comparator 35, respectively.

While phase comparator 9 of FIG. 9 attains the stable state when there is no phase difference between input clock signals RCLK and RCLKD1 and stops outputting pulse signals φU and φD, 90-degrees phase comparator 35 attains the stable state when the phase difference between clock signals RCLK and RCLKD1 becomes 90°. Consequently, 90-degrees phase comparator 35 and control circuit 10 control the delay time of delay circuit 34 such that the phase difference between reference clock signal RCLK and delayed clock signal RCLKD1 becomes 90°.

While delay circuit 8 of FIG. 2 needs to delay reference clock signal RCLK by one period (360°) of reference clock signal RCLK, it suffices for delay circuit 34 of FIG. 16 to delay reference clock signal RCLK by one-fourth period (90°) of reference clock signal RCLK. For instance, assuming that the initial delay unit circuit 11.1 included in delay circuit 8 is formed by 16 stages of inverters, the initial delay unit circuit included in delay circuit 34 is formed by four stages of inverters. Moreover, the delay time of replica circuit 5 constantly becomes the same as the delay time of delay circuit 34.

Sixth Embodiment

In the first embodiment, the duty ratio of reference clock signal RCLK needs to be 50% when it is desirable to generate an internal clock signal intCLK having a duty ratio of 50%. There are cases, however, when the duty ratio of reference clock signal RCLK externally supplied is not 50%. According to the sixth embodiment, it becomes possible to obtain an input clock signal intCLK having a duty ratio of 50% even when the duty ratio of reference clock signal RCLK is not 50%.

Figure 17:
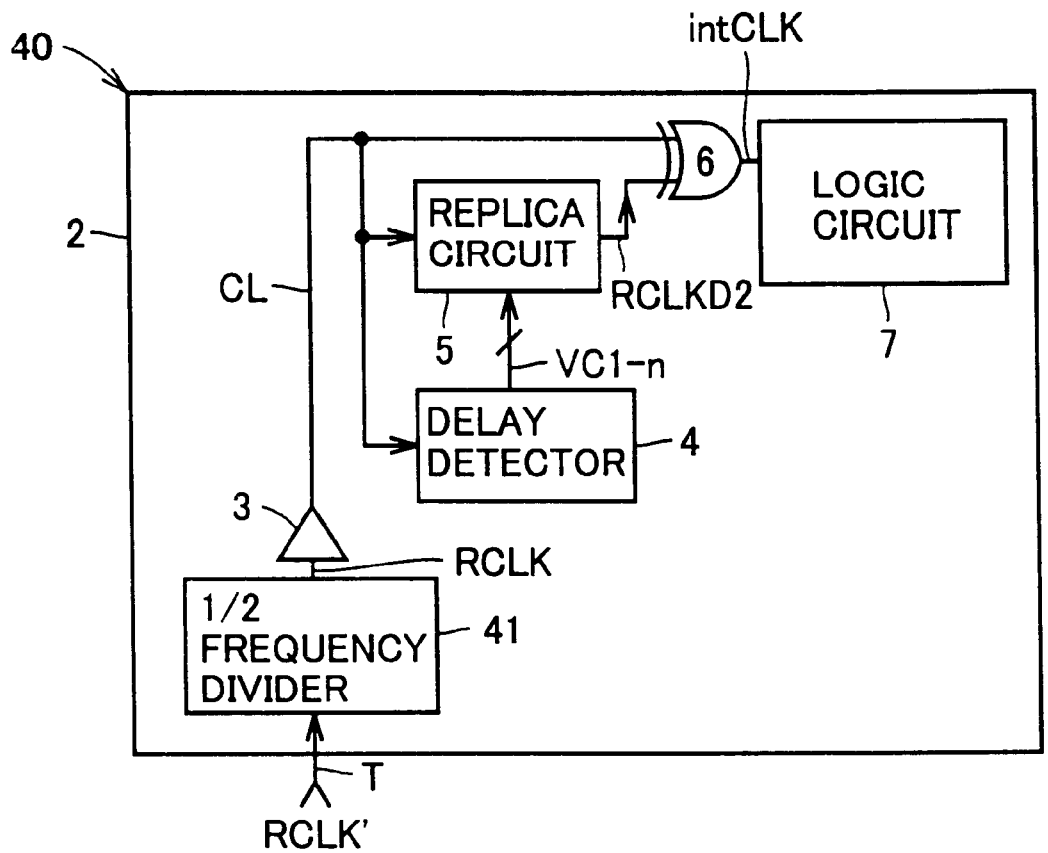
FIG. 17 is a circuit block diagram representing an arrangement of a semiconductor integrated circuit chip according to a sixth embodiment of the present invention.

FIG. 17 is a circuit block diagram representing an arrangement of a semiconductor integrated circuit chip 40 according to the sixth embodiment of the present invention. In FIG. 17, semiconductor integrated circuit chip 40 differs from semiconductor integrated circuit chip 1 of FIG. 1 in that a ½ frequency divider 41 is additionally provided. The ½ frequency divider 41 is interposed between a clock terminal T and clock buffer 3, and divides by two the reference clock signal RCLK' supplied via clock terminal T from outside as well as corrects the duty ratio of reference clock signal RCLK' to 50%.

Figure 18:
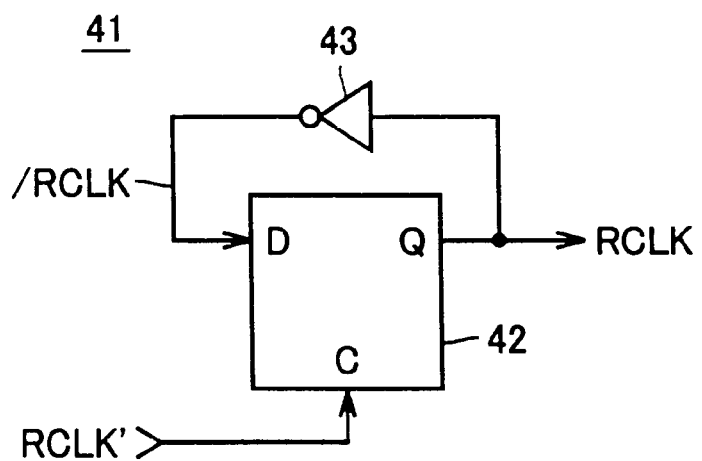
FIG. 18 is a circuit diagram representing an arrangement of a ½ frequency divider shown in FIG. 17.

Thus, as shown in FIG. 18, ½ frequency divider 41 includes a flip-flop 42 and an inverter 43. Reference clock signal RCLK' is input to a clock terminal C of flip-flop 42. Inverter 43 is connected between a data output terminal Q of flip-flop 42 and a data input terminal D. An output signal from flip-flop 42 becomes an output signal RCLK of ½ frequency divider 41.

Figure 19:
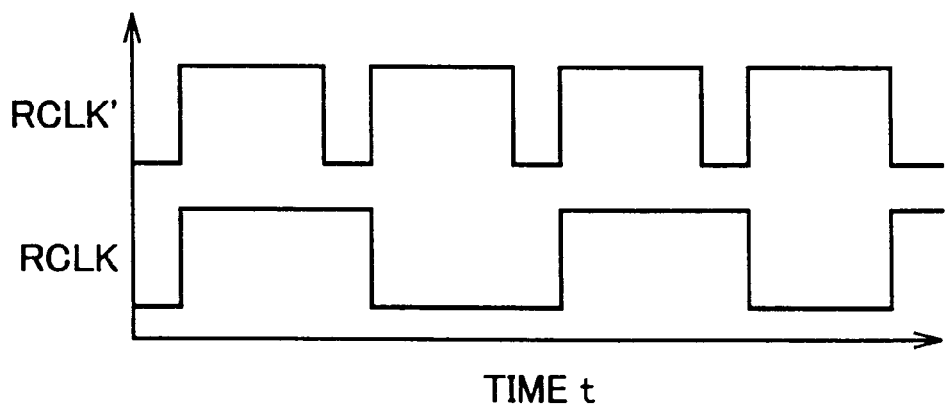
FIG. 19 is a timing chart showing an operation of the ½ frequency divider shown in FIG. 18.

FIG. 19 is a timing chart showing an operation of ½ frequency divider 41. The duty ratio of reference clock signal RCLK' is set to 75%, for instance. Flip-flop 42 takes in a level of an inverted clock signal /RCLK of clock signal RCLK during the period in which reference clock signal RCLK' is at the "L" level, and outputs the level, which was taken in, in response to reference clock signal RCLK' rising from the "L" level to the "H" level. Consequently, output clock signal RCLK of ½ frequency divider 41 becomes the clock signal having a period that is two times that of reference clock signal RCLK' and a duty ratio of 50%.

Moreover, although the frequency of internal clock signal intCLK becomes the same as the frequency of reference clock signal RCLK' in semiconductor integrated circuit chip 40, by providing ½ frequency divider 41 in the semiconductor integrated circuit chips of FIGS. 10 and 13, an internal clock signal intCLK obtained by multiplying reference clock signal RCLK' by two can be derived.

In addition, although ½ frequency divider 41 is employed in the sixth embodiment, a frequency divider having an even greater frequency-division ratio may be employed.

Figure 20:
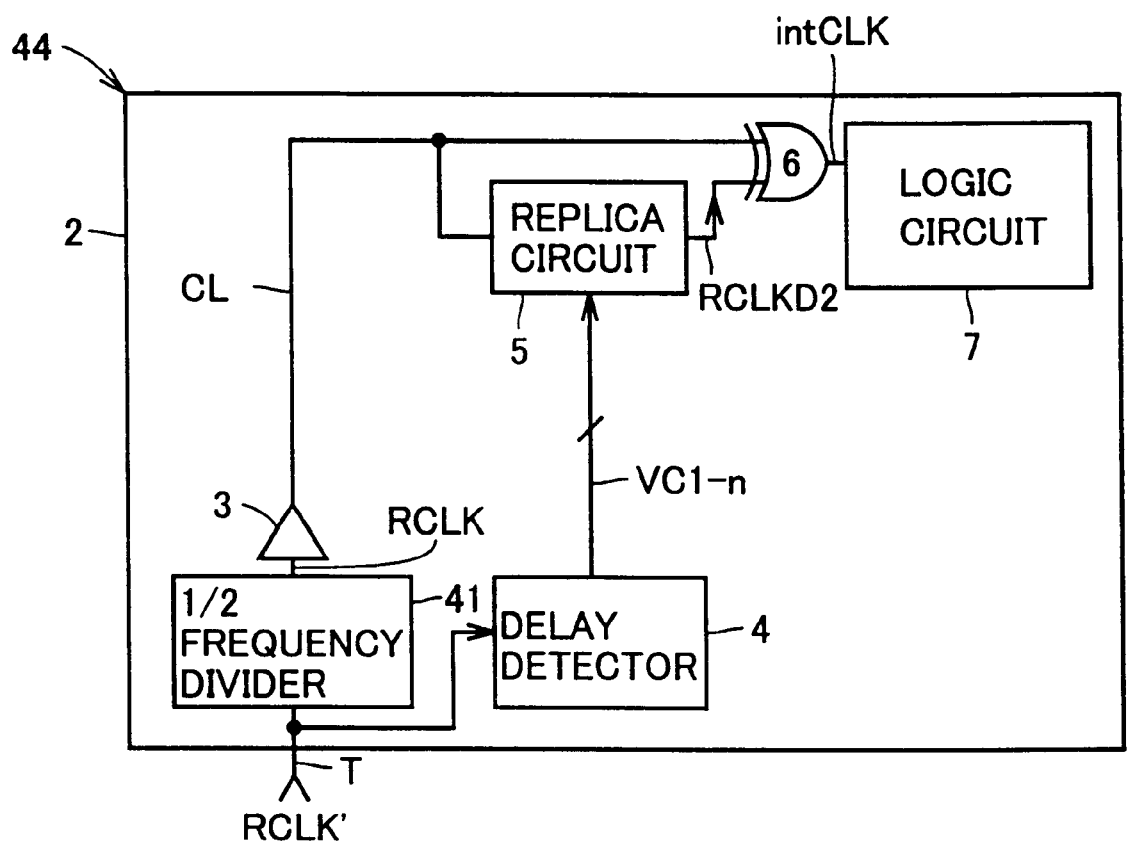
FIG. 20 is a circuit block diagram representing a modification to the sixth embodiment.

Moreover, as shown in FIG. 20, an input node of delay detector 4 may be connected to a clock terminal T of a chip 44. While delay circuit 8 in delay detector 4 in chip 40 of FIG. 17 needs to delay clock signal RCLK by one period of clock signal RCLK, delay circuit 8 in delay detector 4 in chip 44 of FIG. 20 only needs to delay reference clock signal RCLK' by one period of reference clock signal RCLK'. Thus, the circuit scale of delay circuit 8 in delay detector 4 in chip 44 can be made to be one-half of that of chip 40.

Seventh Embodiment

Figure 21:
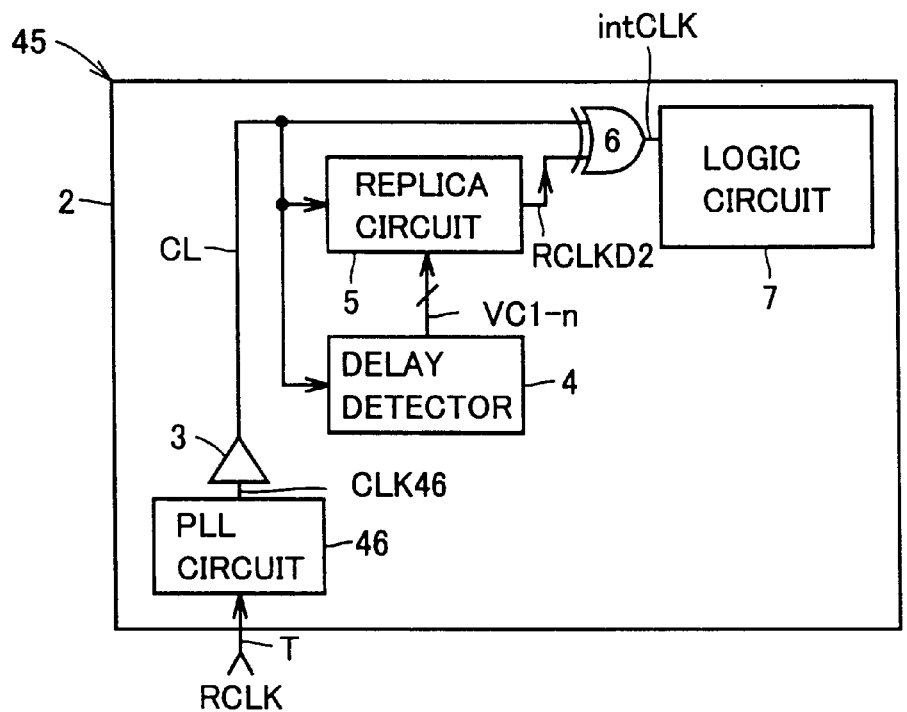
FIG. 21 is a circuit block diagram representing an arrangement of a semiconductor integrated circuit chip according to a seventh embodiment of the present invention.

FIG. 21 is a circuit block diagram representing an arrangement of a semiconductor integrated circuit chip 45 according to the seventh embodiment of the present invention. Referring to FIG. 21, semiconductor integrated circuit chip 45 differs from semiconductor integrated circuit chip 1 in FIG. 1 in that a PLL circuit 46 is interposed between clock terminal T and clock buffer 3. PLL circuit 46 multiplies reference clock signal RCLK by a plural number (for instance, two) to generate a clock signal CLK46, and supplies clock signal CLK46 to clock buffer 3.

Figure 22:
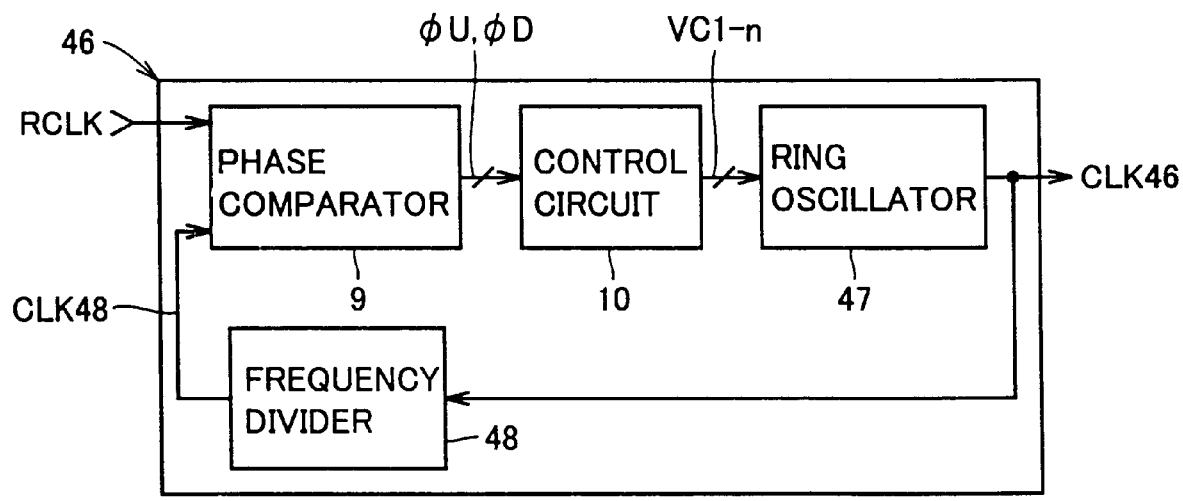
FIG. 22 is a block diagram representing an arrangement of a PLL circuit shown in FIG. 21.
Figure 23:
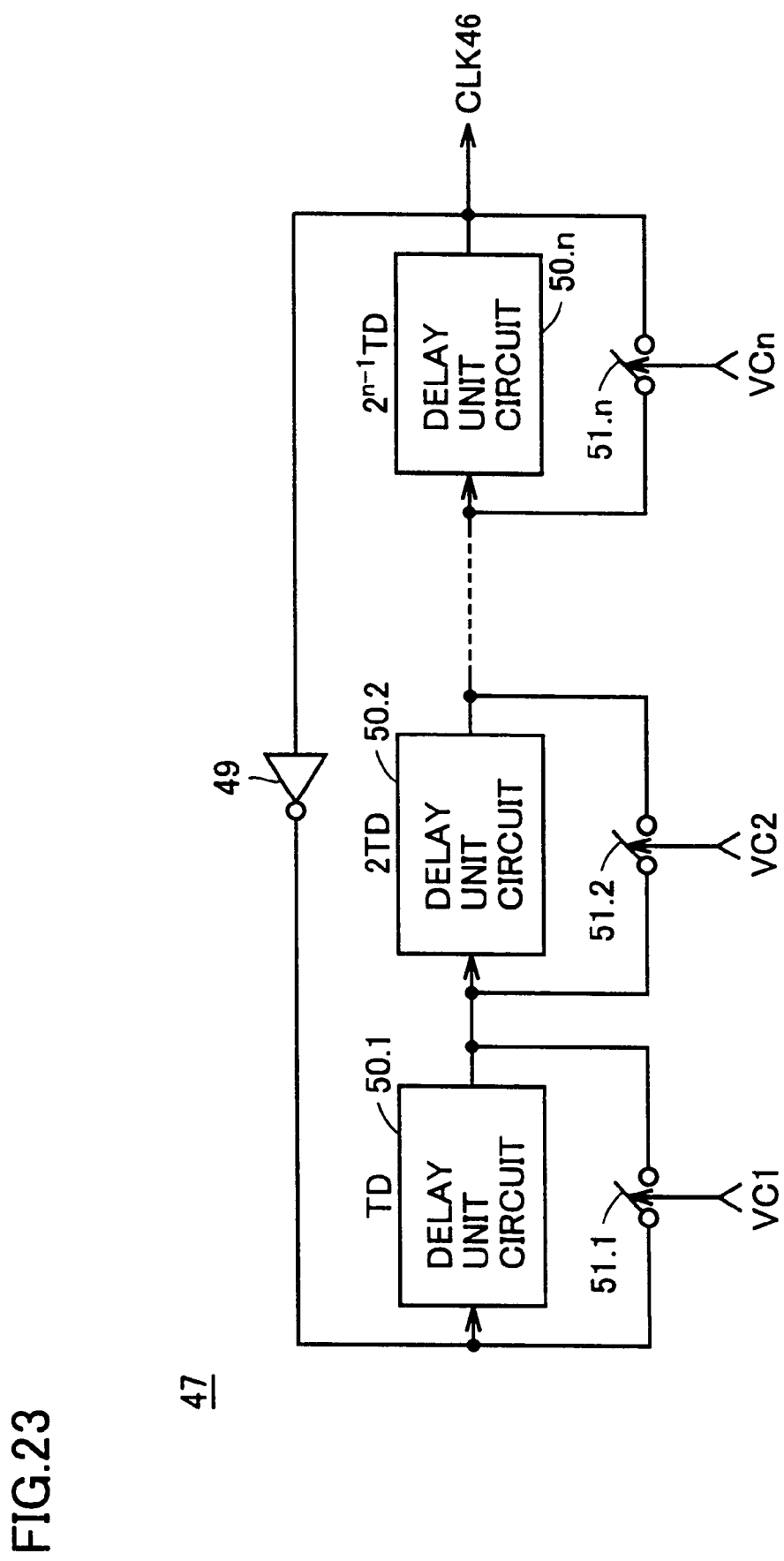
FIG. 23 is a circuit block diagram representing an arrangement of a ring oscillator shown in FIG. 22.

As shown in FIG. 22, PLL circuit 46 has delay circuit 8 of delay detector 4 in FIG. 2 replaced with a ring oscillator 47 and has a frequency divider 48 additionally provided. As shown in FIG. 23, ring oscillator 47 includes an inverter 49 and n delay unit circuits 50.1 to 50.n connected in a ring-like shape, and switches 51.1 to 51.n connected in parallel to delay unit circuits 50.1 to 50.n, respectively.

Delay unit circuit 50.1 has a prescribed delay time TD. The delay times of delay unit circuit 50.1 to 50.n are successively doubled so that the delay time of delay unit circuit 50.n becomes $2^{n-1}$TD. Switches 51.1 to 51.n are respectively controlled by control signals VC1 to VCn from control circuit 10. Switch 51.n is rendered conductive when control signal VCn is at the "L" level, and is rendered non-conductive when control signal VCn is at the "H" level. By setting each of control signals VC1 to VCn to the "H" level or the "L" level, the oscillation frequency of ring oscillator 47 can be changed in $2^n$ stages.

Referring back to FIG. 22, frequency divider 48 divides by a plural number (in this case, by two) output clock signal CLK46 from ring oscillator 47 to generate a clock signal CLK48, and supplies clock signal CLK48 to phase comparator 9. Phase comparator 9 and control circuit 10 controls ring oscillator 47 such that the phases and the frequencies of reference clock signal RCLK and clock signal CLK48 match.

Figure 24:
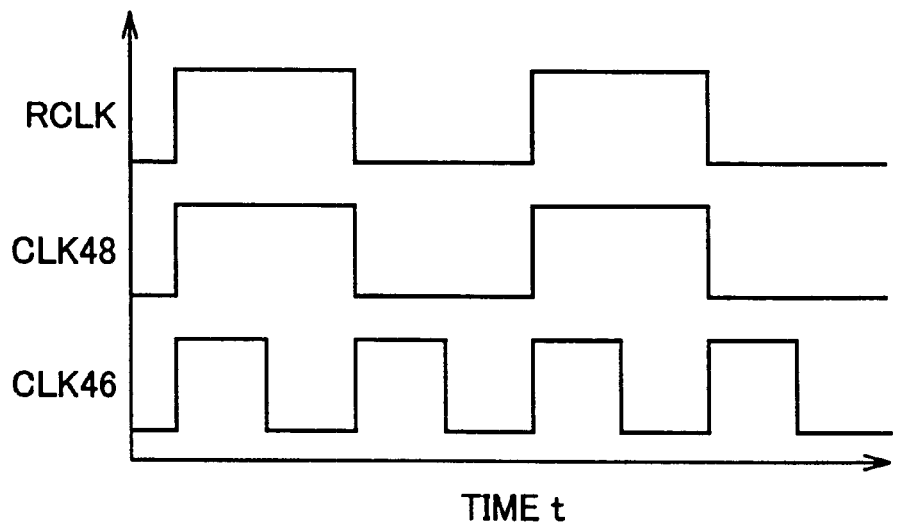
FIG. 24 is a timing chart showing an operation of a PLL circuit shown in FIG. 22.

FIG. 24 is a timing chart showing an operation of PLL circuit 46. In FIG. 24, ring oscillator 47 is controlled such that the frequencies and the phases of reference clock signal RCLK and output clock signal CLK48 of frequency divider 48 match. The clock signal obtained by frequency-dividing by a plural number (by two in the diagram) output clock signal CLK46 from ring oscillator 74 becomes clock signal CLK48. Thus, the clock signal obtained by multiplying clock signal CLK48 by two becomes clock signal CLK46.

Figure 25:
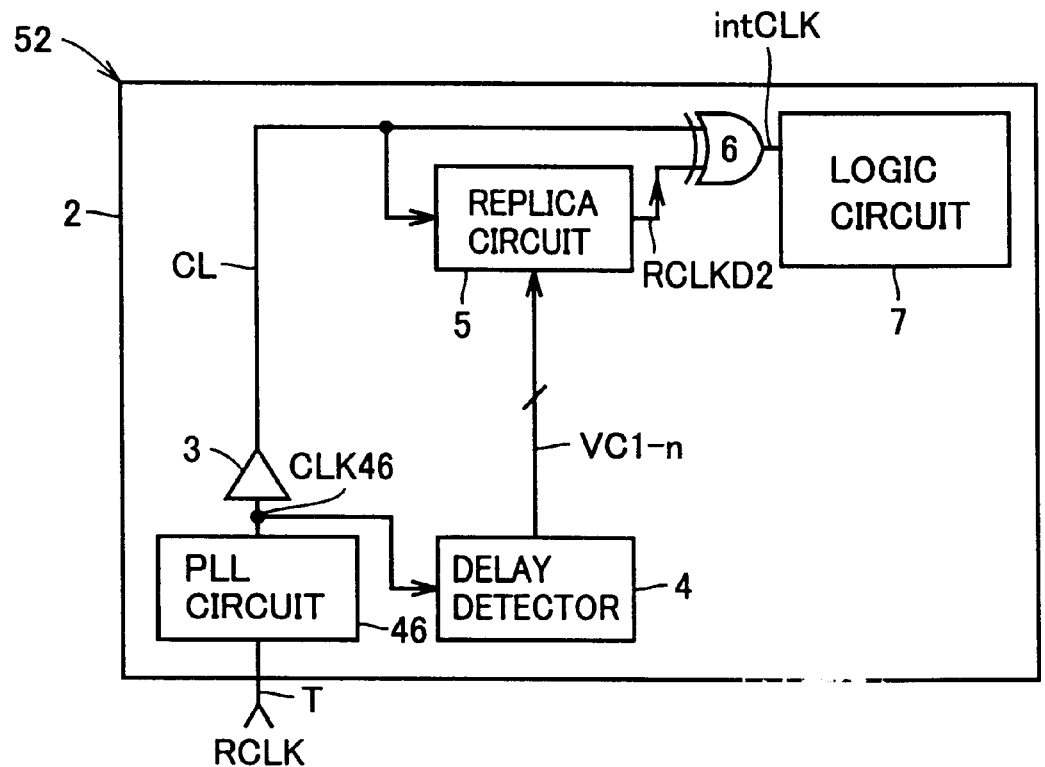
FIGS. 25 and 26 are circuit block diagrams representing modifications to the seventh embodiment.

According to the seventh embodiment, multiplication is effected in two stages of 1) PLL circuit 46 and 2) delay detector 4, replica circuit 5, and EX-OR gate 6 so that an internal clock signal intCLK having an even higher frequency can be generated. In addition, as shown in FIG. 25, an input node of delay detector 4 may be connected to a node between PLL circuit 46 and clock buffer 3. In this case, delay detector 4 can be disposed in a peripheral portion of a chip 52 so that delay detector 4 can be laid out with ease.

Figure 26:
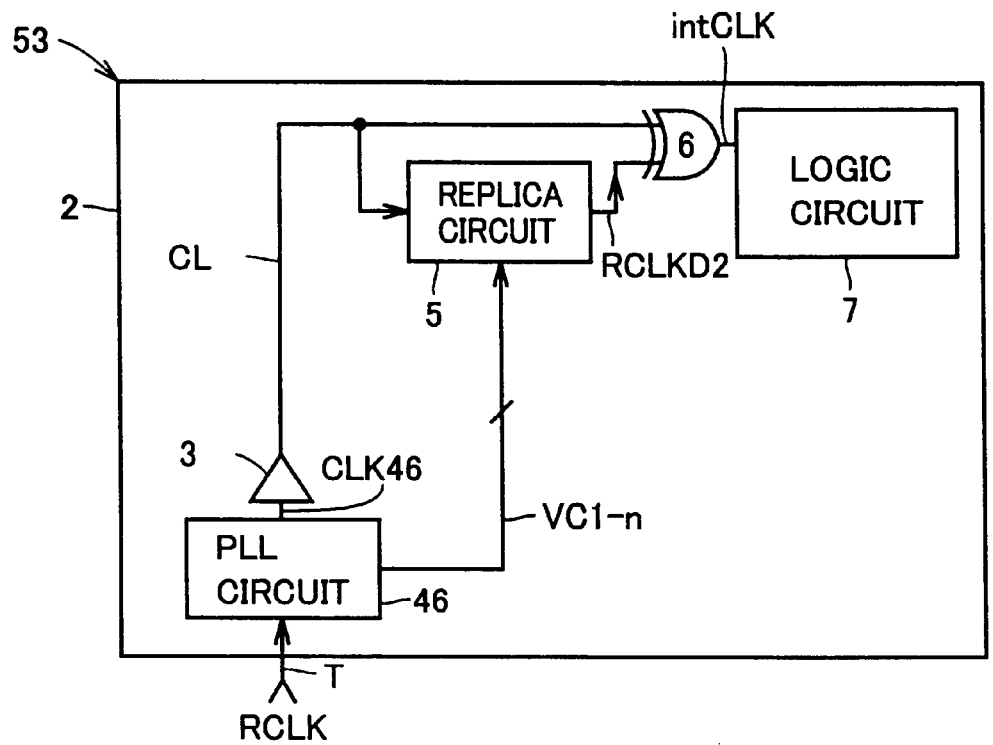

Moreover, as shown in FIG. 26, delay detector 4 may be omitted, and control signals VC1 to VCn of PLL circuit 46 may be supplied to replica circuit 5. In this case, the circuit scale and the layout area can be made smaller by the amount taken up by delay detector 4. There is a need, however, to set the delay times of delay unit circuits 15.1 to 15.n and 50.1 to 50.n such that the delay time of replica circuit 5 becomes one-fourth the period of output clock signal CLK46 of PLL circuit 46.

Eighth Embodiment

Figure 27:
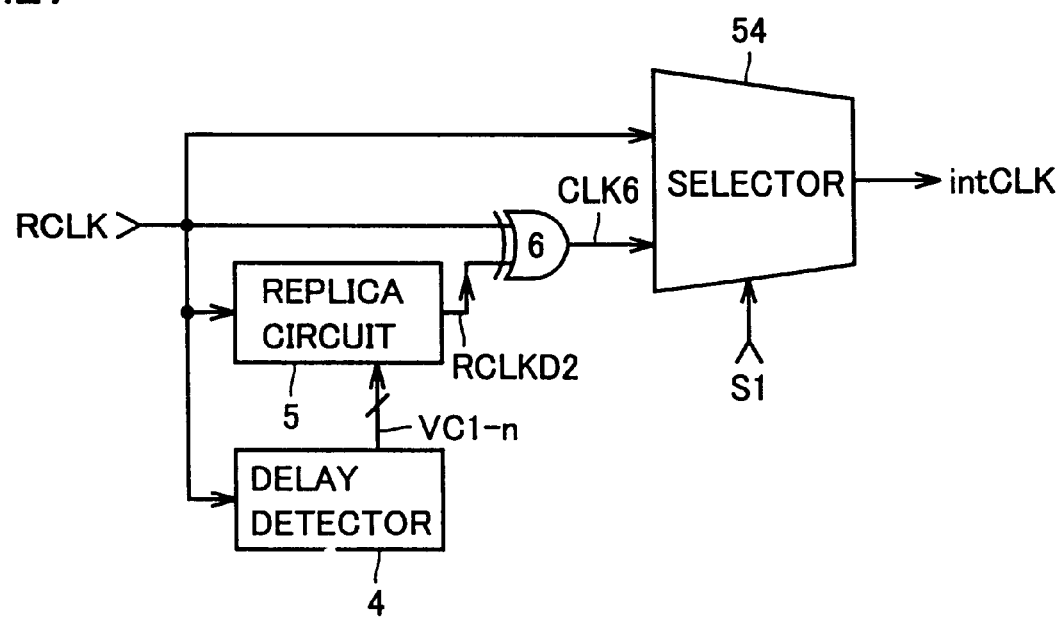
FIG. 27 is a circuit block diagram representing a main portion of a semiconductor integrated circuit chip according to an eighth embodiment of the present invention.

FIG. 27 is a circuit block diagram representing the main portion of a semiconductor integrated circuit chip according to the eighth embodiment of the present invention. In FIG. 27, this semiconductor integrated circuit chip differs from semiconductor integrated circuit chip 1 of FIG. 1 in that a selector 54 is additionally provided.

Selector 54 receives reference clock signal RCLK from clock buffer 3 and output clock signal CLK6 from EX-OR gate 6, selects one of two clock signals RCLK and CLK6 according to a select signal S1, and supplies the selected clock signal as an internal clock signal intCLK to logic circuit 7.

According to the eighth embodiment, one of reference clock signal RCLK and output clock signal CLK6 from EX-OR gate 6 can be selected so that the operating speed of logic circuit 7 can be switched in two levels.

Moreover, although one of two clock signals RCLK and CLK6 is selected in the eighth embodiment, in the semiconductor integrated circuit chip of FIG. 10, for instance, one of three clock signals RCLK, CLK6, and intCLK may be selected.

Ninth Embodiment

Figure 28:
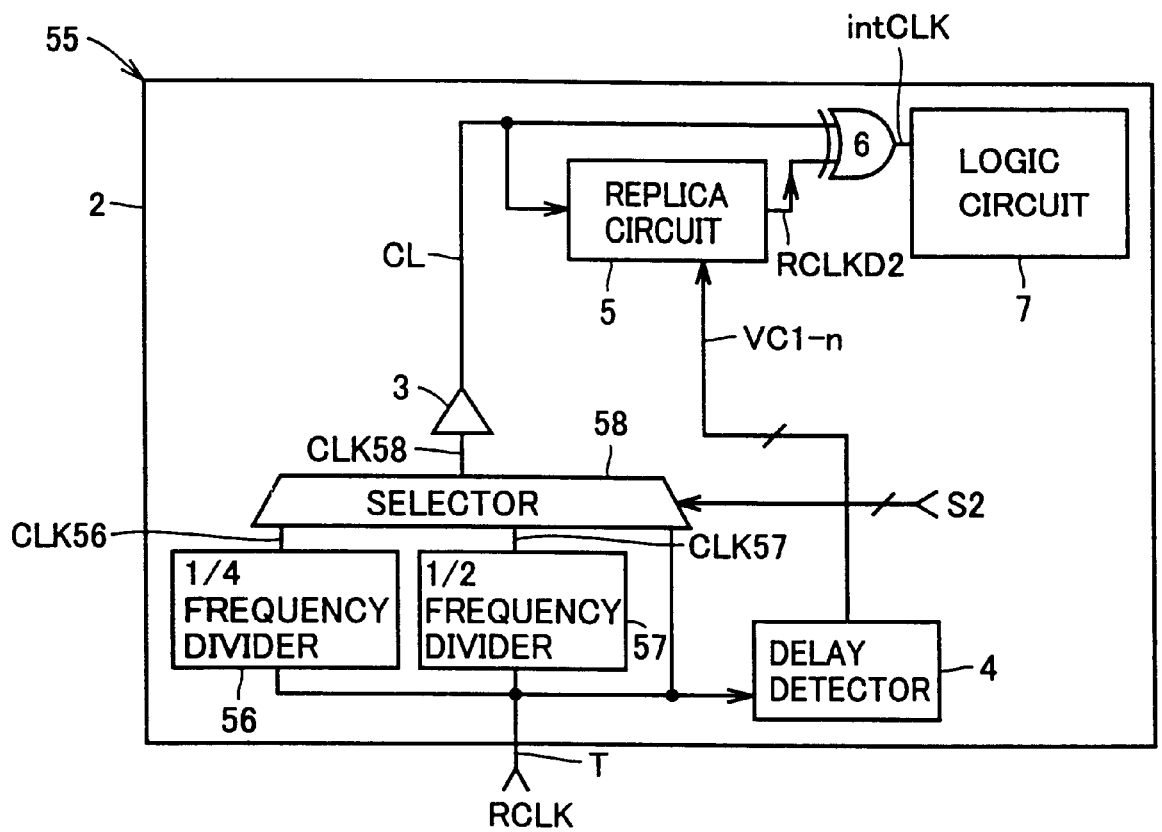
FIG. 28 is a circuit block diagram representing an arrangement of a semiconductor integrated circuit chip according to a ninth embodiment of the present invention.

FIG. 28 is a circuit block diagram representing an arrangement of a semiconductor integrated circuit chip 55 according to the ninth embodiment of the present invention. Referring to FIG. 28, semiconductor integrated circuit chip 55 differs from semiconductor integrated circuit chip 1 in FIG. 1 in that a ¼ frequency divider 56, a ½ frequency divider 57, and a selector 58 are additionally provided and that an input node of delay detector 4 is connected to clock terminal T.

The ¼ frequency divider 56 divides reference clock signal RCLK by four. The ½ frequency divider 57 divides reference clock signal RCLK by two. Selector 58 receives an output clock signal CLK56 from ¼ frequency divider 56, an output clock signal CLK57 from ½ frequency divider 57, and reference clock signal RCLK, selects one of three clock signals CLK56, CLK57, and RCLK according to a select signal S2, and supplies the selected clock signal to clock buffer 3. The selected clock signal is supplied from clock buffer 3 to the replica circuit 5 and EX-OR gate 6.

Figure 29:
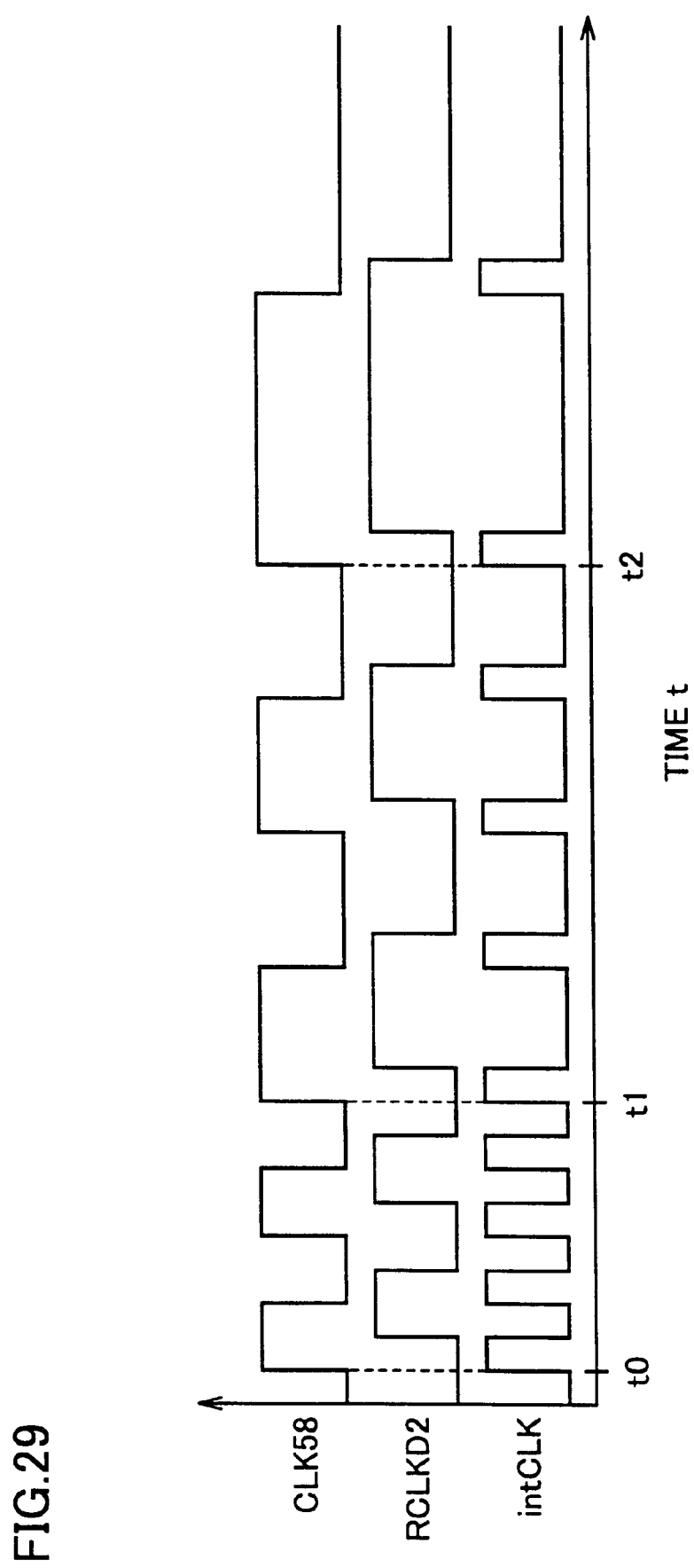
FIG. 29 is a timing chart showing an operation of the semiconductor integrated circuit chip shown in FIG. 28.

FIG. 29 is a timing chart showing a relation among an output clock signal CLK58 from selector 58, output clock signal RCLKD2 from replica circuit 5, and output clock signal intCLK from EX-OR gate 6. In FIG. 29, at a time t0, reference clock signal RCLK is selected by selector 58, and at a time t1, output clock signal CLK57 from ½ frequency divider 57 is selected by selector 58, and at a time t2, output clock signal CLK56 from ¼ frequency divider 56 is selected by selector 58.

Output clock signal RCLKD2 from replica circuit 5 becomes the clock signal obtained by delaying output clock signal CLK58 of selector 58 by one-fourth the period of reference clock signal RCLK. Consequently, output clock signal intCLK of EX-OR gate 6 becomes the clock signal having a frequency that is two times that of reference clock signal RCLK and a duty ratio of 50% from time t0 to t1, becomes the clock signal having the same frequency as reference clock signal RCLK and a duty ratio of 25% from time t1 to time t2, and becomes the clock signal having a frequency that is one-half that of reference clock signal RCLK and a duty ratio of 12.5% from time t2 onward.

According to the ninth embodiment, the frequency of internal clock signal intCLK can be switched in three stages, i.e., two times, one time, and one-half the frequency of reference clock signal RCLK so that the operating speed of logic circuit 7 can be switched in three levels.

Tenth Embodiment

Figure 30:
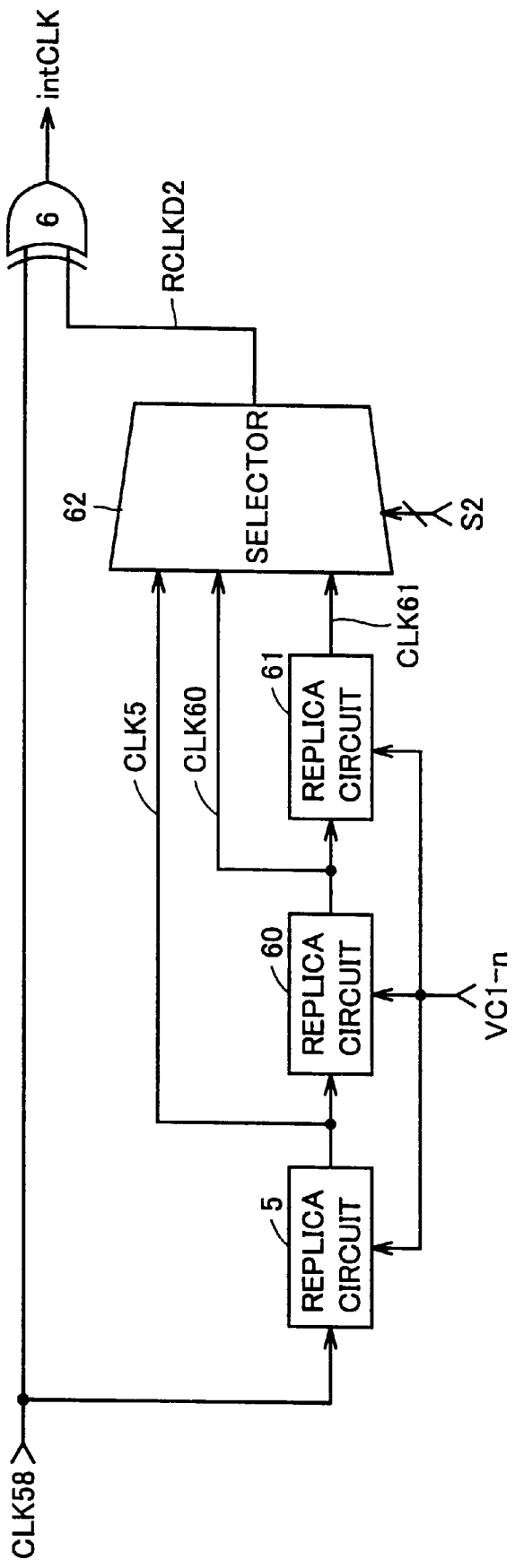
FIG. 30 is a circuit block diagram representing a main portion of a semiconductor integrated circuit chip according to a tenth embodiment of the present invention.

FIG. 30 is a circuit block diagram representing the main portion of a semiconductor integrated circuit chip according to the tenth embodiment of the present invention. In FIG. 30, this semiconductor integrated circuit chip differs from semiconductor integrated circuit chip 55 of FIG. 28 in that replica circuits 60, 61 and a selector 62 are additionally provided. Replica circuit 60 delays output clock signal CLK5 from replica circuit 5 by one-fourth the period of reference clock signal RCLK. Replica circuit 61 delays an output clock signal CLK60 from replica circuit 60 by one-half the period of reference clock signal RCLK.

Consequently, output clock signal CLK5 from replica circuit 5 becomes the clock signal obtained by delaying output clock signal CLK58 of selector 58 by one-fourth period of reference clock signal RCLK, output clock signal CLK60 from replica circuit 60 becomes the clock signal obtained by delaying output clock signal CLK58 from selector 58 by one-half period of reference clock signal RCLK, and an output clock signal CLK61 from replica circuit 61 becomes the clock signal that is obtained by delaying output signal CLK58 from selector 58 by one period of reference clock signal RCLK.

Selector 62 receives output clock signals CLK5, CLK60, and CLK61 from three replica circuits 5, 60, and 61, selects one of three clock signals CLK5, CLK60, and CLK61 according to select signal S2, and supplies the selected clock signal as clock signal RCLKD2 to EX-OR gate 6. When output clock signal CLK56 is selected by selector 58, clock signal CLK5 is selected by selector 62. When clock signal CLK57 is selected by selector 58, clock signal CLK60 is selected by selector 62. When output clock signal CLK56 is selected by selector 58, clock signal CLK61 is selected by selector 62.

Figure 31:
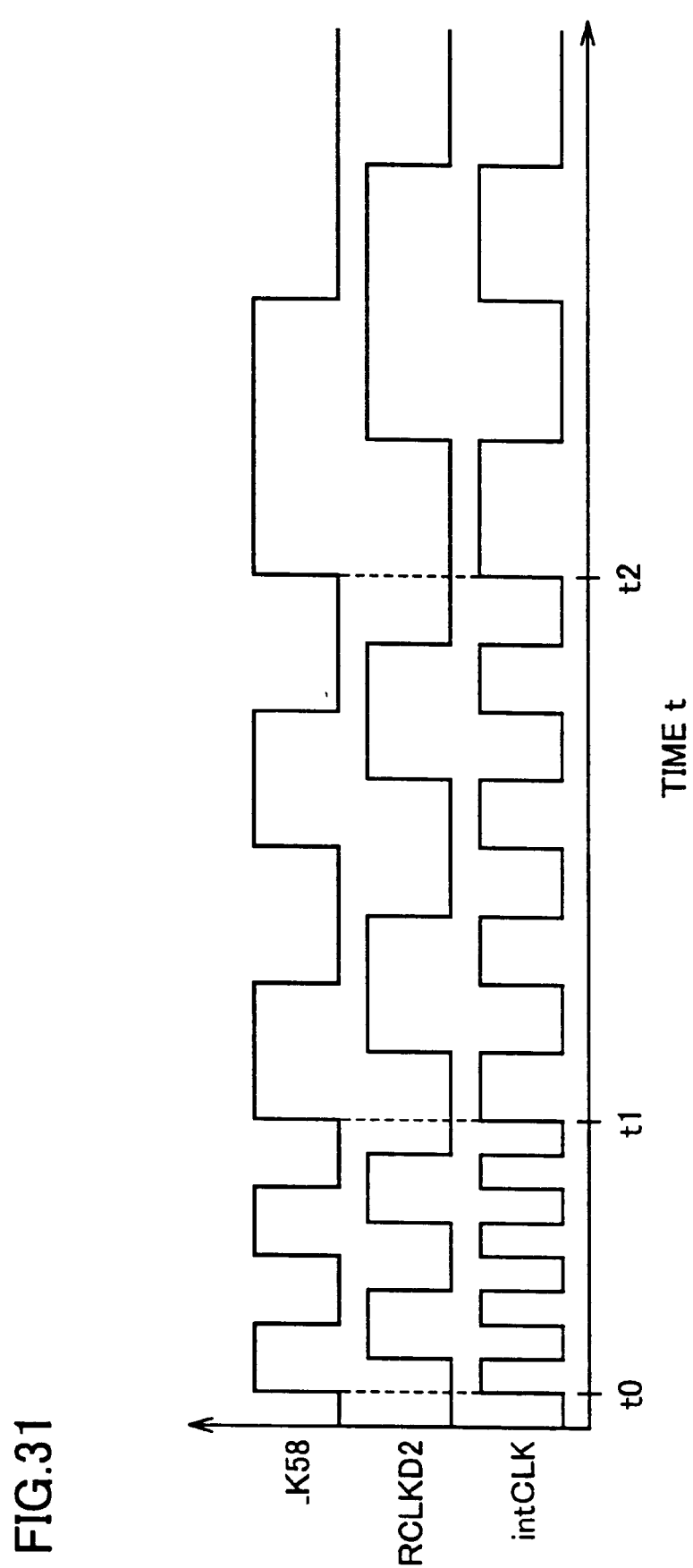
FIG. 31 is a timing chart showing an operation of the semiconductor integrated circuit chip shown in FIG. 30.

FIG. 31 is a timing chart showing a relation among output clock signal CLK58 of selector 58, output clock signal RCLKD2 of selector 62, and output clock signal intCLK of EX-OR gate 6. In FIG. 31, at time t0, clock signals RCLK and CLK5 are selected by selectors 58 and 62, and at time t1, clock signals CLK57 and CLK60 are selected by selectors 58 and 62, and at time t2, clock signals CLK56 and CLK61 are selected by selectors 58 and 62.

Consequently, internal clock signal intCLK becomes the clock signal having a frequency that is two times that of reference clock signal RCLK and a duty ratio of 50% from time t0 to t1, becomes the clock signal having the same frequency as reference clock signal RCLK and a duty ratio of 50% from time t1 to t2, and becomes the clock signal having a frequency that is one-half that of reference clock signal RCLK and a duty ratio of 50% from time t2 onward.

According to the tenth embodiment, while the same effects as those obtained by the ninth embodiment are achieved, the duty ratio of internal clock signal intCLK can be constantly maintained at 50%.

Eleventh Embodiment

Figure 32:
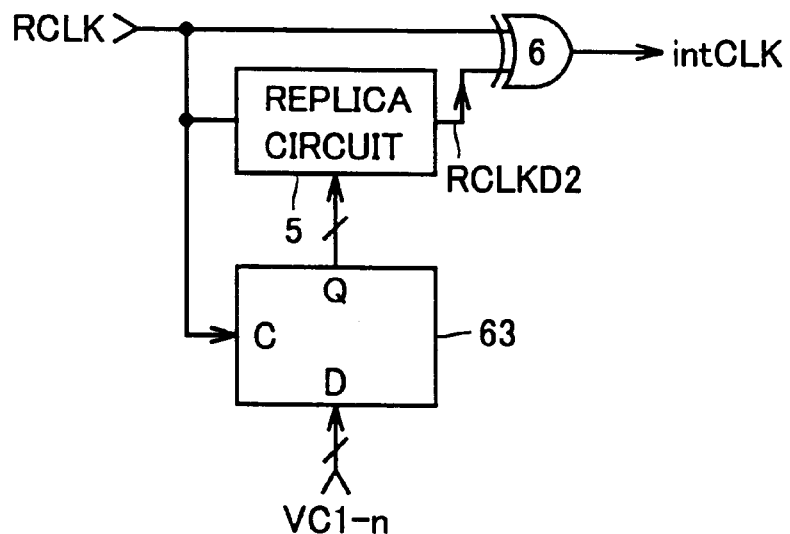
FIG. 32 is a circuit block diagram representing a main portion of a semiconductor integrated circuit chip according to an eleventh embodiment of the present invention.
Figure 33:
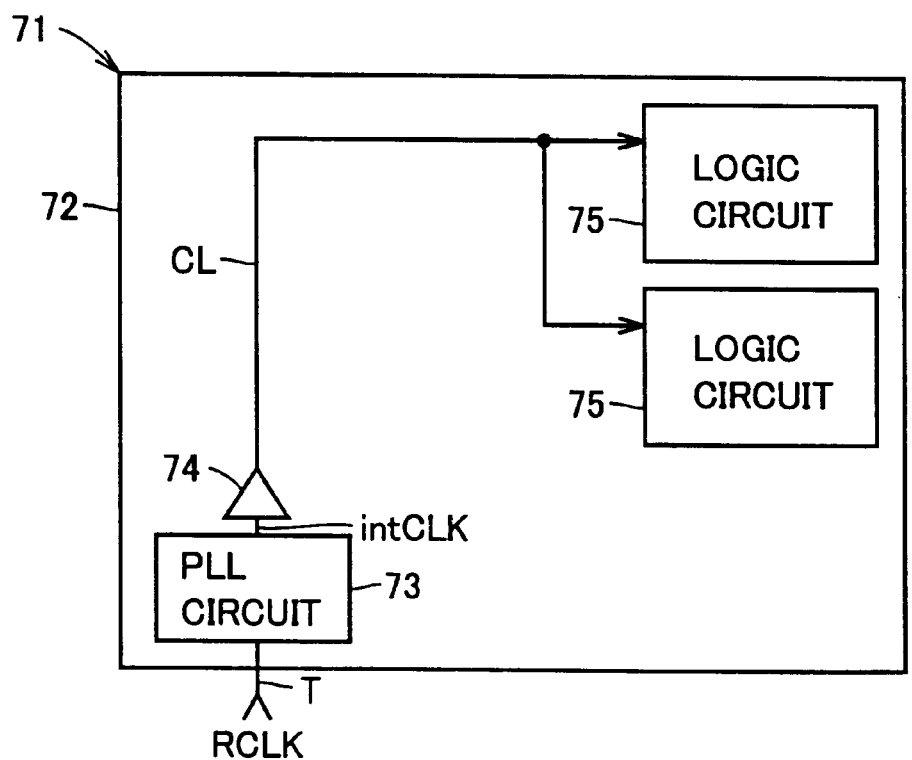
FIG. 33 is a circuit block diagram representing an arrangement of a conventional semiconductor integrated circuit chip.

FIG. 32 is a circuit block diagram representing the main portion of a semiconductor integrated circuit chip according to the eleventh embodiment of the present invention. Referring to FIG. 32, this semiconductor integrated circuit chip differs from semiconductor integrated circuit chip 19 of FIG. 9 in that an n-bit flip-flop 63 is provided corresponding to each replica circuit 5. Flip-flop 63 is provided in the vicinity of a corresponding replica circuit 5. A clock terminal C of flip-flop 63 receives reference clock signal RCLK from clock buffer 3, a data input terminal D of flip-flop 63 receives control signals VC1 to VCn from delay detector 4, and output signals VC1 to VCn from flip-flop 63 are supplied to a corresponding replica circuit 5.

According to the eleventh embodiment, control signals VC1 to VCn are transmitted to a plurality of replica circuits 5 in synchronization with reference clock signal RCLK so that the controllability within the chip improves. Moreover, needless to say, the first to the eleventh embodiments may be appropriately combined.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first delay circuit having a first delay time that is controlled by a control signal for delaying a reference clock signal;
   a second delay circuit having a second delay time that is controlled by said control signal and that is derived by multiplying said first delay time by a first proportionality constant for delaying said reference clock signal;
   a phase control circuit for comparing phases of said reference clock signal and an output clock signal from said first delay circuit to generate said control signal such that a phase difference thereof becomes a predetermined value;
   a first logical circuit for generating a first exclusive-OR signal of said reference clock signal and an output clock signal from said second delay circuit,
   a third delay circuit having a third delay time that is controlled by said control signal and that is derived by multiplying said second delay time by a second proportionality constant for delaying the first exclusive-OR signal from said first logical circuit, and
   a second logical circuit for generating a second exclusive-OR signal of the first exclusive-OR signal from said first logical circuit and an output clock signal from said third delay circuit to supply the second exclusive-OR signal as an internal clock signal to an internal circuit in the semiconductor device.

2. A semiconductor device, comprising:
   a first delay circuit having a first delay time that is controlled by a control signal for delaying a reference clock signal;
   a second delay circuit having a second delay time that is controlled by said control signal and that is derived by multiplying said first delay time by a first proportionality constant for delaying said reference clock signal;
   a phase control circuit for comparing phases of said reference clock signal and an output clock signal from said first delay circuit to generate said control signal such that a phase difference thereof becomes a predetermined value;
   a third delay circuit having a third delay time that is controlled by said control signal and that is equal to said second delay time for delaying an output clock signal from said second delay circuit,
   a fourth delay circuit having a fourth delay time that is controlled by said control signal and that is equal to said second delay time for delaying an output clock signal from said third delay circuit,
   a first logical circuit for generating a first exclusive-OR signal of said reference clock signal and the output clock signal from said second delay circuit,
   a second logical circuit for generating a second exclusive-OR signal of output clock signals from said third and fourth delay circuits, and
   a third logical circuit for generating a third exclusive-OR signal of the first and second exclusive-OR signals from said first and second logical circuits to supply the third exclusive-OR signal to an internal circuit in the semiconductor device as an internal clock signal.

3. A semiconductor device, comprising:
   a first delay circuit having a first delay time that is controlled by a control signal for delaying a reference clock signal;
   a second delay circuit having a second delay time that is controlled by said control signal and that is derived by multiplying said first delay time by a first proportionality constant for delaying said reference clock signal;
   a phase control circuit for comparing phases of said reference clock signal and an output clock signal from said first delay circuit to generate and supply to said first and second delay circuits said control signal such that a phase difference thereof becomes a predetermined value;
   a flip-flop for receiving the control signal generated in said phase control circuit and supplying the received control signal to said second delay circuit in synchronization with said reference clock signal; and
   an internal clock generating circuit for generating and supplying to an internal circuit in the semiconductor device an internal clock signal obtained by multiplying said reference clock signal by N based on said reference clock signal and an output clock signal from said second delay circuit.

4. A semiconductor device, comprising:
   a first delay circuit having a first delay time that is controlled by a control signal for delaying a reference clock signal;
   a second delay circuit having a second delay time that is controlled by said control signal and that is derived by multiplying said first delay time by a first proportionality constant for delaying said reference clock signal;
   a phase control circuit for comparing phases of said reference clock signal and an output clock signal from said first delay circuit to generate and supply to said first and second delay circuits said control signal such that a phase difference thereof becomes a predetermined value;
   an internal clock generating circuit for generating an internal clock signal obtained by multiplying said reference clock signal by N based on said reference clock signal and an output clock signal from said second delay circuit; and
   a selector for selecting one of said internal clock signal and said reference clock signal according to a select signal to supply the selected clock signal to an internal circuit in the semiconductor device.

5. A semiconductor device, comprising:

a clock buffer for receiving and transmitting a reference clock signal;

a first delay circuit having an input coupled to an input of said clock buffer and receiving the reference clock signal, said first delay circuit having a first delay time that is controlled by a control signal for delaying said reference clock signal;

a second delay circuit having an input coupled to an output of said clock buffer and receiving the reference clock signal, said second delay circuit having a second delay time that is controlled by said control signal and that is derived by multiplying said first delay time by a first proportionality constant for delaying said reference clock signal;

a phase control circuit for comparing phases of said reference clock signal received from the input of said clock buffer and an output clock signal from said first delay circuit to generate and supply to said first and second delay circuits said control signal such that a phase difference thereof becomes a predetermined value; and an internal clock generating circuit for generating and supplying to an internal circuit in the semiconductor device an internal clock signal obtained by multiplying said reference clock signal by N based on said reference clock signal transmitted from an output of said clock buffer and an output clock signal from said second delay circuit.

6. The semiconductor device according to claim 5, comprising multiple sets of the internal circuit, the second delay circuit, and the internal clock generating circuit, wherein said first delay circuit and said phase control circuit are provided in common to said multiple sets of the internal circuit, the second delay circuit, and the internal clock generating circuit.

7. The semiconductor device according to claim 5, wherein the reference clock signal received by the clock buffer is an external clock signal supplied from outside a semiconductor chip constituting the semiconductor device.

8. The semiconductor device according to claim 5, further comprising a PLL (Phase Locked Loop) circuit for receiving an external clock signal from outside a semiconductor chip constituting the semiconductor device, and multiplying said external clock signal to generate said reference clock signal received by the clock buffer.

9. The semiconductor device according to claim 5, wherein a path for transmitting the internal clock signal from the internal clock generating circuit to the internal circuit is shorter than a path in the semiconductor device for transmitting the reference clock signal to the second delay circuit, and also shorter than a path in the semiconductor device for transmitting the reference clock signal to the internal clock generating circuit.

10. A semiconductor device, comprising:

a frequency divider for dividing an external clock signal to generate a reference clock signal;

a first delay circuit having a first delay time that is controlled by a control signal for delaying said external clock signal;

a second delay circuit having a second delay time that is controlled by said control signal and that is derived by multiplying said first delay time by a predetermined proportionality constant for delaying said reference clock signal;

a phase control circuit for comparing phases of said external clock signal and an output clock signal from said first delay circuit to generate and supply to said first and second delay circuits said control signal such that a phase difference thereof becomes a predetermined value; and an internal clock generating circuit for generating and supplying to an internal circuit in the semiconductor device an internal clock signal obtained by multiplying said reference clock signal by N based on said reference clock signal and an output clock signal from said second delay circuit.

11. The semiconductor device according to claim 10, wherein said internal clock generating circuit includes a logical circuit for generating as said internal clock signal an exclusive-OR signal of said reference clock signal and the output clock signal from said second delay circuit.

12. The semiconductor device according to claim 10, comprising a plurality of frequency dividers, wherein said plurality of frequency dividers have frequency-division ratios that are different from one another, said semiconductor device further comprising a first selector for selecting one of said plurality of frequency dividers according to a select signal and supplying an output clock signal from a selected frequency divider as said reference clock signal to said second delay circuit and said internal clock generating circuit.

13. The semiconductor device according to claim 12, comprising a plurality of second delay circuits, wherein said plurality of second delay circuits have second delay times that are different from one another, said semiconductor device further comprising a second selector for selecting one of said plurality of second delay circuits according to said select signal and supplying an output clock signal from a selected second delay circuit to said internal clock generating circuit.

14. The semiconductor device according to claim 10, wherein a path for transmitting the internal clock signal from the internal clock generating circuit to the internal circuit is shorter than a path for transmitting the reference clock signal from the frequency divider to the second delay circuit, and also shorter than a path for transmitting the reference clock signal from the frequency divider to the internal clock generating circuit.

15. A semiconductor device, comprising:

a ring oscillator for generating a first clock signal having a period controlled by a control signal;

a delay circuit having a delay time that is controlled by said control signal and that is derived by multiplying the period of said first clock signal by a predetermined proportionality constant for delaying said first clock signal;

a frequency divider for dividing said first clock signal to generate a second clock signal;

a phase control circuit for comparing phases of a reference clock signal and said second clock signal and generating and supplying to said ring oscillator and said delay circuit said control signal such that a phase difference thereof becomes a predetermined value; and an internal clock generating circuit for generating and supplying to an internal circuit in the semiconductor device an internal clock signal that is obtained by multiplying said reference clock signal by N based on said first clock signal and an output clock signal from said delay circuit.

16. The semiconductor device according to claim 15, wherein said internal clock generating circuit includes a logical circuit for generating as said internal clock signal an exclusive-OR signal of said first clock signal and the output clock signal from said delay circuit.

17. A semiconductor device, comprising:

a first delay circuit having a first delay time that is controlled by a control signal for delaying a reference clock signal;

a second delay circuit having a second delay time that is controlled by said control signal and that is derived by multiplying said first delay time by a first proportionality constant for delaying said reference clock signal;

a phase control circuit for comparing phases of said reference clock signal and an output clock signal from said first delay circuit to generate and supply to said first and second delay circuits said control signal such that a phase difference thereof becomes a predetermined value; and an internal clock generating circuit for generating and supplying to an internal circuit in the semiconductor device an internal clock signal obtained by multiplying said reference clock signal by N based on said reference clock signal and an output clock signal from said second delay circuit, wherein a path for transmitting the internal clock signal from the internal clock generating circuit to the internal circuit is shorter than a path in the semiconductor device for transmitting the reference clock signal to the second delay circuit, and also shorter than a path in the semiconductor device for transmitting the reference clock signal to the internal clock generating circuit.

* * * * *